(12) United States Patent
Lubomirsky et al.

(10) Patent No.: US 7,827,930 B2
(45) Date of Patent: Nov. 9, 2010

(54) APPARATUS FOR ELECTROLESS DEPOSITION OF METALS ONTO SEMICONDUCTOR SUBSTRATES

(75) Inventors: Dmitry Lubomirsky, Cupertino, CA (US); Arulkumar Shanmugasundram, Sunnyvale, CA (US); Russell Ellwanger, San Juan Bautista, CA (US); Ian A. Pancham, San Francisco, CA (US); Ramakrishna Cheboli, Sunnyvale, CA (US); Timothy W. Weidman, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 798 days.

(21) Appl. No.: 11/043,442

(22) Filed: Jan. 26, 2005

(65) Prior Publication Data

US 2005/0263066 A1 Dec. 1, 2005

Related U.S. Application Data

(63) Continuation-in-part of application No. 10/996,342, filed on Nov. 22, 2004, now Pat. No. 7,323,058, which is a continuation-in-part of application No. 10/680,325, filed on Oct. 6, 2003, now Pat. No. 7,223,308.

(60) Provisional application No. 60/539,491, filed on Jan. 26, 2004.

(51) Int. Cl.
    *B05C 3/02* (2006.01)
(52) U.S. Cl. .................... 118/500; 118/52; 118/319; 118/320; 118/420; 118/429
(58) Field of Classification Search .............. 204/275.1, 204/269, 298.15; 118/52, 319, 320, 410, 118/428, 429, 500; 427/240; 156/345.1, 156/345.11, 345.23
See application file for complete search history.

(56) References Cited

U.S. PATENT DOCUMENTS 2,369,620 A 2/1945 Sullivan et al.

(Continued)

FOREIGN PATENT DOCUMENTS

EP 0 329 406 8/1989

(Continued)

OTHER PUBLICATIONS

U.S. Appl. No. 09/245,780. (Dordi, et al.), filed Feb. 5, 1999.

(Continued)

*Primary Examiner*—Laura Edwards
(74) *Attorney, Agent, or Firm*—Patterson & Sheridan, LLP

(57) ABSTRACT

An electroless deposition system is provided. The system includes a processing mainframe, at least one substrate cleaning station positioned on the mainframe, and an electroless deposition station positioned on the mainframe. The electroless deposition station includes an environmentally controlled processing enclosure, a first processing station configured to clean and activate a surface of a substrate, a second processing station configured to electrolessly deposit a layer onto the surface of the substrate, and a substrate transfer shuttle positioned to transfer substrates between the first and second processing stations. The system also includes a substrate transfer robot positioned on the mainframe and configured to access an interior of the processing enclosure. The system also includes a substrate a fluid delivery system that is configured to deliver a processing fluid by use of a spraying process to a substrate mounted in the processing enclosure.

21 Claims, 17 Drawing Sheets

U.S. PATENT DOCUMENTS

| | | |
|---|---|---|
| 3,937,857 A | 2/1976 | Brummett et al. |
| 4,006,047 A | 2/1977 | Brummett et al. |
| 4,113,492 A | 9/1978 | Sato et al. |
| 4,232,060 A | 11/1980 | Mallory et al. |
| 4,234,628 A | 11/1980 | DuRose |
| 4,265,943 A | 5/1981 | Goldstein et al. |
| 4,364,803 A | 12/1982 | Nidola et al. |
| 4,368,223 A | 1/1983 | Kobayashi et al. |
| 4,397,812 A | 8/1983 | Mallory et al. |
| 4,428,815 A | 1/1984 | Powell et al. |
| 4,432,635 A | 2/1984 | Mayer et al. |
| 4,616,596 A | 10/1986 | Helber, Jr. et al. |
| 4,632,857 A | 12/1986 | Mallory, Jr. |
| 4,758,926 A | 7/1988 | Herrell et al. |
| 4,810,520 A | 3/1989 | Wu |
| 4,894,260 A | 1/1990 | Kumasaka et al. |
| 4,968,375 A | 11/1990 | Sato et al. |
| 5,147,692 A | 9/1992 | Bengston |
| 5,203,911 A | 4/1993 | Sricharoenchaikit et al. |
| 5,223,310 A | 6/1993 | Singh et al. |
| 5,224,504 A | 7/1993 | Thompson et al. |
| 5,230,743 A | 7/1993 | Thompson et al. |
| 5,235,139 A | 8/1993 | Bengston et al. |
| 5,240,497 A | 8/1993 | Shacham et al. |
| 5,248,527 A | 9/1993 | Uchida et al. |
| 5,380,560 A | 1/1995 | Kaja et al. |
| 5,384,284 A | 1/1995 | Doan et al. |
| 5,415,890 A | 5/1995 | Kloiber et al. |
| 5,423,716 A | 6/1995 | Strasbaugh |
| 5,478,462 A | 12/1995 | Walsh |
| 5,510,216 A | 4/1996 | Calabrese et al. |
| 5,566,744 A | 10/1996 | Tepman |
| 5,622,593 A | 4/1997 | Arasawa et al. |
| 5,648,125 A | 7/1997 | Cane |
| 5,695,810 A | 12/1997 | Dubin et al. |
| 5,705,223 A | 1/1998 | Bunkofske |
| 5,720,818 A | 2/1998 | Donde et al. |
| 5,733,816 A | 3/1998 | Iyer et al. |
| 5,755,859 A | 5/1998 | Brusic et al. |
| 5,801,442 A | 9/1998 | Hamilton et al. |
| 5,804,456 A | 9/1998 | Aintila |
| 5,824,599 A | 10/1998 | Schacham-Diamond et al. |
| 5,830,805 A | 11/1998 | Shacham-Diamand et al. |
| 5,843,538 A | 12/1998 | Ehrsam et al. |
| 5,846,598 A | 12/1998 | Semkow et al. |
| 5,885,749 A | 3/1999 | Huggins et al. |
| 5,891,513 A | 4/1999 | Dubin et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,932,077 A | 8/1999 | Reynolds |
| 5,933,757 A | 8/1999 | Yoshikawa et al. |
| 5,966,940 A | 10/1999 | Gower et al. |
| 5,969,422 A | 10/1999 | Ting et al. |
| 5,998,240 A | 12/1999 | Hamilton et al. |
| 6,010,962 A | 1/2000 | Liu et al. |
| 6,015,724 A | 1/2000 | Yamazaki |
| 6,015,747 A | 1/2000 | Lopatin et al. |
| 6,065,424 A | 5/2000 | Schacham-Diamond et al. |
| 6,066,575 A | 5/2000 | Reardon et al. |
| 6,077,780 A | 6/2000 | Dubin |
| 6,107,199 A | 8/2000 | Allen et al. |
| 6,110,530 A | 8/2000 | Chen et al. |
| 6,113,702 A | 9/2000 | Halpin et al. |
| 6,113,771 A | 9/2000 | Landau et al. |
| 6,136,163 A | 10/2000 | Cheung et al. |
| 6,136,693 A | 10/2000 | Chan et al. |
| 6,140,234 A | 10/2000 | Uzoh et al. |
| 6,144,099 A | 11/2000 | Lopatin et al. |
| 6,153,935 A | 11/2000 | Edelstein et al. |
| 6,154,369 A | 11/2000 | Martinez, Jr. et al. |
| 6,171,661 B1 | 1/2001 | Zheng et al. |
| 6,174,812 B1 | 1/2001 | Hsiung et al. |
| 6,177,661 B1 | 1/2001 | Lee et al. |
| 6,180,523 B1 | 1/2001 | Lee et al. |
| 6,197,150 B1 * | 3/2001 | Kwag et al. ............ 156/345.23 |
| 6,197,181 B1 | 3/2001 | Chen |
| 6,197,364 B1 | 3/2001 | Paunovic et al. |
| 6,197,688 B1 | 3/2001 | Simpson |
| 6,228,233 B1 | 5/2001 | Lakshmikanthan et al. |
| 6,239,038 B1 | 5/2001 | Wen |
| 6,241,825 B1 | 6/2001 | Wytman |
| 6,242,349 B1 | 6/2001 | Nogami et al. |
| 6,245,670 B1 | 6/2001 | Cheung et al. |
| 6,251,236 B1 | 6/2001 | Stevens |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,267,853 B1 * | 7/2001 | Dordi et al. ................. 204/232 |
| 6,277,263 B1 | 8/2001 | Chen |
| 6,290,833 B1 | 9/2001 | Chen |
| 6,291,348 B1 | 9/2001 | Lopatin et al. |
| 6,303,010 B1 | 10/2001 | Woodruff et al. |
| 6,309,520 B1 | 10/2001 | Woodruff et al. |
| 6,309,524 B1 | 10/2001 | Woodruff et al. |
| 6,319,387 B1 | 11/2001 | Krishnamoorthy et al. |
| 6,323,128 B1 | 11/2001 | Sambucetti et al. |
| 6,342,733 B1 | 1/2002 | Hu et al. |
| 6,344,410 B1 | 2/2002 | Lopatin et al. |
| 6,368,966 B1 | 4/2002 | Krishnamoorthy et al. |
| 6,416,647 B1 | 7/2002 | Dordi et al. |
| 6,432,819 B1 | 8/2002 | Pavate et al. |
| 6,436,267 B1 | 8/2002 | Carl et al. |
| 6,436,816 B1 | 8/2002 | Lee et al. |
| 6,441,492 B1 | 8/2002 | Cunningham |
| 6,444,027 B1 * | 9/2002 | Yang et al. .................. 117/200 |
| 6,463,938 B2 | 10/2002 | Bran |
| 6,465,765 B2 | 10/2002 | Katayama et al. |
| 6,486,533 B2 | 11/2002 | Krishnamoorthy et al. |
| 6,516,815 B1 | 2/2003 | Stevens et al. |
| 6,528,409 B1 | 3/2003 | Lopatin et al. |
| 6,548,411 B2 | 4/2003 | Wirth et al. |
| 6,565,729 B2 * | 5/2003 | Chen et al. ..................... 205/82 |
| 6,573,606 B2 | 6/2003 | Sambucetti et al. |
| 6,605,874 B2 | 8/2003 | Leu et al. |
| 6,616,967 B1 | 9/2003 | Test |
| 6,645,550 B1 | 11/2003 | Cheung et al. |
| 6,666,949 B1 | 12/2003 | Hillman et al. |
| 6,699,380 B1 | 3/2004 | Chen et al. |
| 6,717,189 B2 | 4/2004 | Inoue et al. |
| 6,743,473 B1 | 6/2004 | Parkhe et al. |
| 6,806,186 B2 | 10/2004 | Chen et al. |
| 6,811,675 B2 | 11/2004 | Chen |
| 6,824,612 B2 | 11/2004 | Stevens et al. |
| 6,824,621 B2 | 11/2004 | Shibagaki |
| 6,846,519 B2 | 1/2005 | Ivanov et al. |
| 6,908,512 B2 | 6/2005 | Ivanov et al. |
| 6,913,651 B2 | 7/2005 | Ivanov et al. |
| 7,223,308 B2 | 5/2007 | Pancham et al. |
| 7,235,483 B2 | 6/2007 | Ivanov |
| 2001/0030366 A1 | 10/2001 | Nakano et al. |
| 2002/0036143 A1 | 3/2002 | Segawa et al. |
| 2002/0083960 A1 | 7/2002 | Wirth et al. |
| 2002/0098681 A1 | 7/2002 | Hu et al. |
| 2002/0108861 A1 | 8/2002 | Emesh et al. |
| 2003/0010645 A1 | 1/2003 | Ting et al. |
| 2003/0075808 A1 | 4/2003 | Inoue et al. |
| 2003/0116439 A1 | 6/2003 | Seo et al. |
| 2003/0181040 A1 | 9/2003 | Ivanov et al. |
| 2003/0190426 A1 | 10/2003 | Padhi et al. |
| 2004/0052963 A1 | 3/2004 | Ivanov et al. |
| 2004/0084143 A1 | 5/2004 | Ivanov et al. |

| 2004/0094186 | A1 | 5/2004 | Ivanov |
| 2004/0097071 | A1 | 5/2004 | Ivanov |
| 2004/0234696 | A1 | 11/2004 | Hongo et al. |
| 2005/0072525 | A1 | 4/2005 | Pancham et al. |

FOREIGN PATENT DOCUMENTS

| EP | 0 475 567 | 3/1992 |
| EP | 0 913 498 | 5/1999 |
| EP | 1114882 | 7/2001 |
| EP | 1 209 251 A2 | 5/2002 |
| EP | 1 496 542 | 1/2005 |
| GB | 2285174 | 6/1995 |
| JP | 1127979 | 5/1989 |
| JP | 4131395 | 5/1992 |
| JP | 7-297543 | 11/1995 |
| JP | 11-124682 | 5/1999 |
| JP | 2001-508599 | 6/2001 |
| JP | 2002-129344 | 5/2002 |
| JP | 2003-115474 | 4/2003 |
| JP | 2003-129250 | 5/2003 |
| JP | 2003-129251 | 5/2003 |
| TW | 492151 | 6/2002 |
| TW | 494531 | 7/2002 |
| TW | 520542 | 2/2003 |
| WO | WO-9722419 | 6/1997 |
| WO | WO-9722733 | 6/1997 |
| WO | WO 99/54920 | 10/1999 |
| WO | WO-9954920 | 10/1999 |

OTHER PUBLICATIONS

Eze, F. C., 'Electroless deposition of CoO thin films, J. Phys. D: Appl. Phys. 32 (1999), pp. 533-540.
Eze, et al., 'Chemical-bath-deposited cobalt sulphide films: preparation effects; Materials Chemistry and Physics, 47 (1997), pp. 31-36.
Lopatin, et al., "Thin Electroless barrier for copper films", Part of the SPIE Conference of Multilevel Interconnect technology II, SPIE vol. 3508 (1998), pp. 65-77.
Pearlstein, Fred. "Electroless Plating;" J. Res. Natl. Bur. Stan., Ch. 31 (1963), pp. 710-747.
The Chinese Journal of Nonferrous Metals, vol. 10, No. 1, Feb. 2, 2000, Abstract included.
Shacham-Diamond, et al., "Electrochemically deposited thin film alloys for ULSI and MEMS applications," Microelectronic Engineering 50 (2000), pp. 525-531.
Saito, et al., "Electroless deposition of Ni-B. Co-B and Ni-Co-B alloys using dimethylamineborane as a reducing agent," Journal of Applied Electrochemistry 28 (1998). pp. 559-563.
Schacham-Diamond, et al. "Material properties of electroless 100-200 nm thick CoWP films," Electrochemical Society Proceedings, vol. 99-34, pp. 102-110.
Yosi Shacham-Diamond, et al. "High Aspect Ratio Quarter-Micron Electroless Copper Integrated Technology", Microelectronic Engineering 37/38 (1997) pp. 77-88.
C.K. Hu, et al. "Reduced Electromigration of Cu Wires by Surface Coating" Applied Physics Letters, vol. 81. No. 10, Sep. 2, 2002—pp. 1782-1784.
Lin, et al., "Manufacturing of Cu Electroless Nicket/Sn-Pb Flip Chip Solder Bumps", IEEE Transactions on Advanced Packaging. vol. 22, No. 4 (Nov. 1999). pp. 575-579.
Lowenheim, Frederick A., *Modern Electroplating*, Chapter 31, pp. 70-79 ($3^{rd}$ ed., Wiley & Sons 1974).
"Metallization & Interconnect", Semitool Products, printed Oct. 27, 1998, 4 pages.
"Wafer Back Surface Film Removal", Colombo, L., Central R&D, SGS-Thomson Microelectronics, Agrate, Italy, 6 pages.
"Tantalum, Copper and Damascene: The Future of Interconnects", Singer, P., Semiconductor International, Jun. 1998, 6 pages.
VERTEQ Online, Products Overview, printed Oct. 27, 1998, 5 pages.
"Electric Contacts" Theory and Application, Holm, R. and Holm, E., Springer-Verlag New York, Inc., 1967, 27 pages.
"Ney Contact Manual", Pitney, K.E., 1974, 19 pages.
"Wafer Processing", Singer, P., Semiconductor International, Jun. 1998, p. 70.
Sugihara et al., "Plating fog generation in the forming of printed circuits by the additive method", *Journal of Applied Electrochemistry*, 27(9) (Sep. 1997), pp. 1111-1117.
Partial PCT Search Report for PCT/US04/032879 dated Jan. 11, 2005.
PCT International Search Report and Written Opinion for PCT/US04/032879 dated Apr. 6, 2005.
U.S. Appl. No. 99/522,726 "MOCVD Approach to Deposit Tantalum Nitride Films" (Kalyanam et al.) dated Mar. 10, 2000.
PCT International Search Report and Written Opinion dated Mar. 4, 2009 for International Application No. PCT/US2006/002619.
PCT Invitation to Pay Additional Fees and Partial International Search Report for International Application No. PCT/US2006/002619 dated Jan. 28, 2009.
Prosecution History for U.S. Appl. No. 11/175,251, filed Jul. 6, 2005.
Prosecution History for U.S. Appl. No. 11/743,413, filed May 2, 2007.
JP Office Action for Patent Application No. P2006-534275, dated Jul. 21, 2009.
Office Action dated Jul. 6, 2010 and Search Report for Taiwan Patent Application No. 95102179.
Office Action dated Jun. 1, 2010 and Search Report for Taiwan Patent Application No. 95124386.

* cited by examiner

APPARATUS FOR ELECTROLESS DEPOSITION OF METALS ONTO SEMICONDUCTOR SUBSTRATES

CROSS-REFERENCE TO RELATED APPLICATIONS

This application claims benefit of U.S. Provisional Patent Application Ser. No. 60/539,491, filed Jan. 26, 2004. This application claims benefit of U.S. Provisional Patent Application Ser. No. 60/575,553, filed May 28, 2004.

This application is a continuation-in-part of U.S. patent application Ser. No. 10/996,342, filed Nov. 22, 2004, now U.S. Pat. No. 7,323,058 which claims benefit of U.S. Provisional Patent Application Ser. No. 60/539,491, filed Jan. 26, 2004. This application is also a continuation-in-part of U.S. patent application Ser. No. 10/680,325, filed Oct. 6, 2003, now U.S. Pat. No. 7,223,308.

BACKGROUND OF THE INVENTION

1. Field of the Invention

Embodiments of the invention generally relate to an electroless deposition system for semiconductor processing.

2. Description of the Related Art

Metallization of sub 100 nanometer sized features is a foundational technology for present and future generations of integrated circuit manufacturing processes. More particularly, in devices such as ultra large scale integration-type devices, i.e., devices having integrated circuits with several million logic gates, the multilevel interconnects that lie at the heart of these devices are generally formed by filling high aspect ratio, i.e., greater than about 25:1, interconnect features with a conductive material, such as copper. At these dimensions, conventional deposition techniques, such as chemical vapor deposition and physical vapor deposition, are not able to reliably fill interconnect features. As a result, plating techniques, i.e., electrochemical plating and electroless plating, have emerged as promising processes for void free filling of sub 100 nanometer sized high aspect ratio interconnect features in integrated circuit manufacturing processes. Additionally, electrochemical and electroless plating processes have also emerged as promising processes for depositing post deposition layers, such as capping layers.

However, with regard to electroless plating processes, conventional electroless processing systems and methods have faced several challenges, such as accurately controlling the deposition process and the defect ratios in the resulting deposition layers. More particularly, conventional systems have suffered from poor substrate temperature control, as the resistive heaters and heat lamps used on conventional electroless cells have not had the ability to provide a uniform temperature across the surface of the substrate, which is critical to the uniformity of electroless deposition processes. Additionally, conventional electroless systems have not implemented control over the environment inside the electroless deposition chamber, which has recently been shown to have a substantial impact on defect ratios.

Also, due to environmental and cost-of-ownership (CoO) concerns it may desirable to reduce the waste of expensive electroless plating processing chemicals by reducing the required flow to get sufficient uniform coverage on the receiving surface of the substrate. Since the speed and uniformity with which the electroless processing solutions are delivered to the substrate surface can affect the deposition process results, an apparatus and method is needed to uniformly deliver the various processing solutions. It is also desirable to control the substrate temperature by use of conduction and convective heat transfer on the backside of the substrate when a fluid is in contact with, and flowing between, the substrate and a supporting base plate member.

Further, a functional and efficient integrated platform for electroless deposition processes capable of depositing uniform layers with minimal defects has not been developed. As such, there is a need for an integrated electroless deposition apparatus capable of depositing uniform layers having minimal defects.

SUMMARY OF THE INVENTION

Embodiments of the invention provide an electroless deposition system. The system includes a processing mainframe, at least one substrate cleaning station positioned on the mainframe, and at least one electroless deposition station positioned on the mainframe. The electroless deposition station includes an environmentally controlled processing enclosure, a first processing station configured to clean and activate a surface of a substrate, a second processing station configured to electrolessly deposit a layer onto the surface of the substrate, and a substrate transfer shuttle positioned to transfer substrates between the first and second processing stations. The system also includes a substrate transfer robot positioned on the mainframe and configured to access an interior of the processing enclosure.

Embodiments of the invention also provide an electroless deposition system configured to efficiently deposit conductive layers onto semiconductor substrates with minimal defects. The system includes an electroless deposition enclosure positioned on a processing mainframe. The deposition enclosure interior environment is pressure and temperature controlled and includes a first and a second substrate processing station. The first substrate processing station is configured to clean and activate a substrate, while the second substrate processing station is configured to electrolessly deposit a layer onto the substrate. A substrate shuttle is positioned in the enclosure and is configured to transport substrates between the respective stations.

Embodiments of the invention further provide a deposition system for semiconductor processing. An embodiment of the deposition system generally includes a processing enclosure defining an environmentally controlled processing volume, a first fluid processing cell positioned in the processing volume, a second fluid processing cell positioned in the processing volume, and a substrate shuttle positioned in the processing volume and configured to pivotally transfer a substrate between the first and second fluid processing cells. The first and second fluid processing cells generally include a fluid diffusion member, a substrate support assembly configured to support a substrate in parallel relationship with the fluid diffusion member, and a fluid dispensing arm movably positioned to dispense a processing fluid onto the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of the inventions and are therefore not to be considered limiting of its scope, for the inventions may admit to other equally effective embodiments.

DETAILED DESCRIPTION OF THE PREFERRED EMBODIMENT

Figure 1:
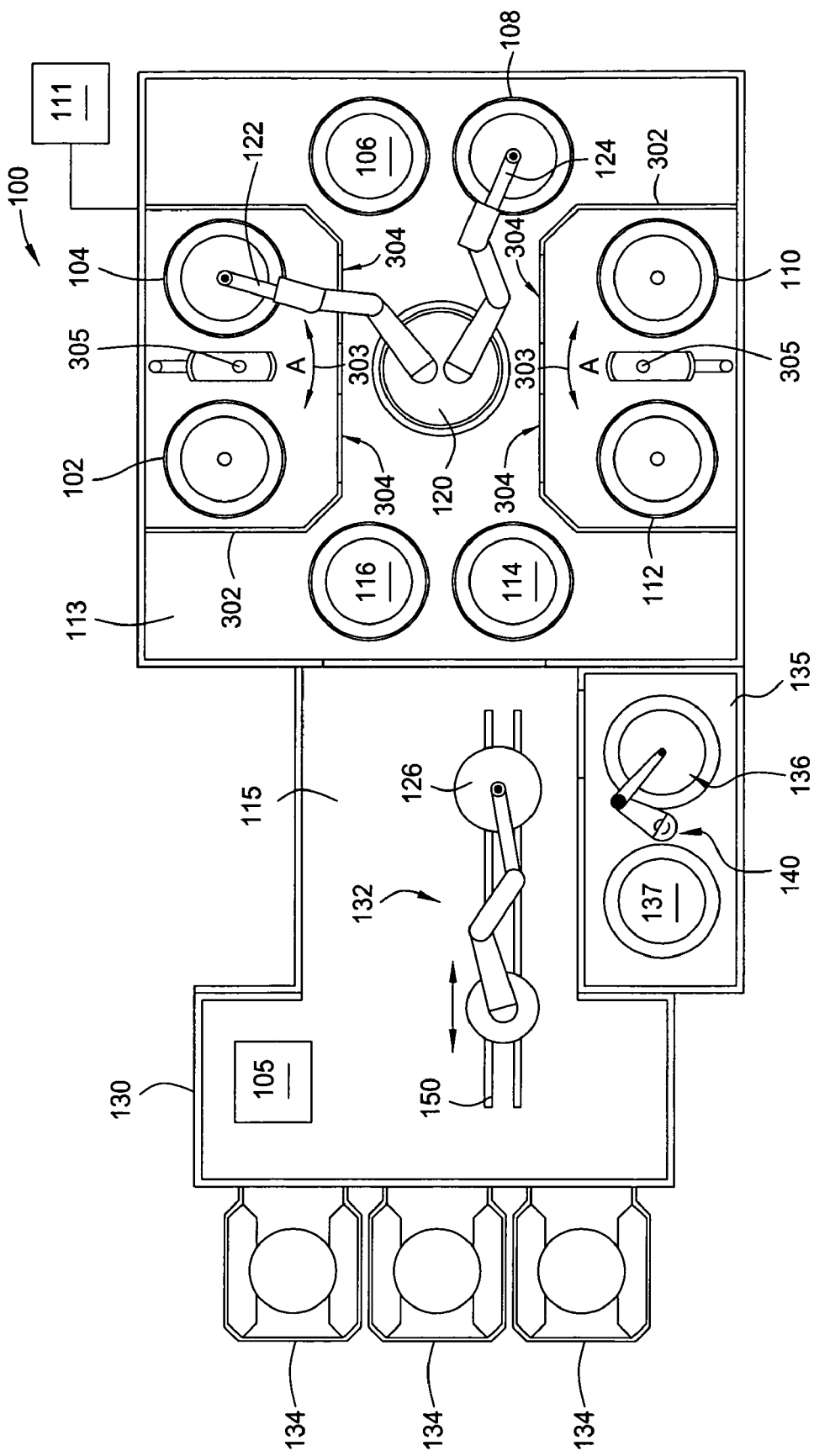
FIG. 1 is a plan view of an exemplary electroless plating.

FIG. 1 illustrates an embodiment of an electroless deposition system 100. System 100 includes a factory interface 130 that includes a plurality of substrate loading stations 134 configured to interface with substrate containing cassettes. A factory interface robot 132 is positioned in the factory interface 130 and is configured to access and transfer substrates 126 into and out of the cassettes positioned on the loading stations 134. The robot 132 also extends into a link tunnel 115 that connects the factory interface 130 to a processing mainframe 113. The position of robot 132 allows for access to loading stations 134 to retrieve substrates therefrom, and to then deliver the substrates 126 to one of the processing cell locations 114, 116 positioned on the mainframe 113, or alternatively, to the annealing station 135. Similarly, robot 132 may be used to retrieve a substrate 126 from the processing cell locations 114, 116 or the annealing station 135 after a substrate processing sequence is complete. In this situation robot 132 may deliver the substrate 126 back to one of the cassettes positioned on the loading stations 134 for removal from system 100.

The factory interface 130 may also include a metrology inspection station 105, which may be used to inspect substrates before and/or after processing in system 100. The metrology inspection station 105 may be used, for example, to analyze the characteristics, e.g., thickness, planarity, grain structure, topography, etc., of materials deposited on the substrate. Exemplary metrology inspection stations that may be used in embodiments of the invention include the BX-30 Advanced Interconnect Measurement System, and CD-SEM or DR-SEM inspection stations, all of which are commercially available from Applied Materials, Inc. of Santa Clara, Calif. An exemplary metrology inspection station is also illustrated in commonly assigned U.S. Patent Application Ser. No. 60/513,310, filed on Oct. 21, 2003, entitled "Plating System with Integrated Substrate Inspection", which is hereby incorporated by reference in its entirety to the extent not inconsistent with the present invention.

The annealing station 135 generally includes a two position annealing station, wherein a cooling plate 136 and a heating plate 137 are positioned adjacent each other with a substrate transfer robot 140 positioned proximate thereto, e.g., between the two stations. The substrate transfer robot 140 is generally configured to move substrates between the heating plate 137 and the cooling plate 136. System 100 may include a plurality of annealing stations 135, wherein the stations 135 may be in a stacked configuration. Further, although the annealing chamber 135 is illustrated as being positioned such that it is accessed from the link tunnel 115, embodiments of the invention are not limited to any particular configuration or placement of the annealing station 135. As such, the anneal station 135 may be positioned in direct communication with the mainframe 113, i.e., accessed by mainframe robot 120, or alternatively, the annealing station 135 may be positioned in communication with the mainframe 113, i.e., the annealing station may be positioned on the same system as mainframe 113, but may not be in direct contact with the mainframe 113 or accessible from the mainframe robot 120. For example, as illustrated in FIG. 1, the anneal station 135 may be positioned in direct communication with the link tunnel 115, which allows for access to mainframe 113 via robots 132 and/or 120. Additional description of the anneal chamber 135 and the operation thereof may be found in commonly assigned U.S. patent application Ser. No. 10/823,849, entitled "Two Position Anneal Chamber," filed on Apr. 13, 2004, now U.S. Pat. No. 7,311,810 which is hereby incorporated by reference in its entirety to the extent not inconsistent with the present invention.

Processing mainframe 113 includes a centrally positioned mainframe substrate transfer robot 120. Mainframe robot 120 generally includes one or more blades 122, 124 configured to support and transfer substrates. Additionally, mainframe robot 120 and the accompanying blades 122, 124 are generally configured to independently extend, rotate, pivot, and vertically move so that the mainframe robot 120 may simultaneously insert and remove substrates to/from the plurality of processing cell locations 102, 104, 106, 108, 110, 112, 114, 116 positioned on mainframe 113. Similarly, factory interface robot 132 also includes the ability to rotate, extend, pivot, and vertically move its substrate support blade, while also allowing for linear travel along the robot track 150 that extends from the factory interface 130 to the mainframe 113.

Generally, the processing cell locations 102, 104, 106, 108, 110, 112, 114, 116 may be any number of processing cells utilized in a substrate processing system. More particularly, the processing cells or locations may be configured as electrochemical plating cells, rinsing cells, bevel clean cells, spin rinse dry cells, substrate surface cleaning cells (which collectively includes cleaning, rinsing, and etching cells), electroless plating cells (which includes pre and post clean cells, activation cells, deposition cells, etc.), metrology inspection stations, and/or other processing cells that may be beneficially used in conjunction with a deposition processing system and/or platform.

Each of the respective processing cell locations 102, 104, 106, 108, 110, 112, 114, 116 and robots 132, 120 are generally in communication with a process controller 111, which may be a microprocessor-based control system configured to receive inputs from both a user and/or various sensors positioned on the system 100, and appropriately control the operation of system 100 in accordance with the inputs and/or a predetermined processing recipe. Additionally, the processing cell locations 102, 104, 106, 108, 110, 112, 114, 116 are also in communication with a fluid delivery system (not shown) configured to supply the necessary processing fluids to the respective processing cell locations during processing, which is also generally under the control of system controller 111. An exemplary processing fluid delivery system may be found in commonly assigned U.S. patent application Ser. No. 10/438,624, entitled, "Multi-Chemistry Electrochemical Processing System," filed on May 14, 2003, now abandoned, which is hereby incorporated by reference in its entirety to the extent not inconsistent with the present invention.

In an exemplary electroless deposition system 100, as illustrated in FIG. 1, the processing cell locations 102, 104, 106, 108, 110, 112, 114, 116 may be configured as follows. Processing cell locations 114 and 116 may be configured as an interface between the wet processing stations on the mainframe 113 and the generally dry processing stations or regions in the link tunnel 115, annealing station 135, and the factory interface 130. The processing cell locations 114, 116 located at the interface may be spin rinse dry cells and/or substrate cleaning cells, for example. Each of the processing cell locations 114 and 116 may include a spin rinse dry cell and a substrate cleaning cell in a stacked configuration. Alternatively, processing cell location 114 may include a spin rinse dry cell, while cell location 116 may include a substrate cleaning cell. In yet another embodiment, each of the cell locations 114, 116 may include a combination spin rinse dry cell and substrate cleaning cell. A detailed description of an exemplary spin rinse dry cell that may be used in embodiments of the invention may be found in commonly assigned U.S. patent application Ser. No. 10/680,616, entitled "Spin Rinse Dry Cell," filed on Oct. 6, 2003, now abandoned which is hereby incorporated by reference in its entirety to the extent not inconsistent with the present invention.

Processing cell locations 106, 108 may be configured as substrate cleaning cells, and more particularly, processing cell locations 106, 108 may be configured as substrate bevel cleaning cells, i.e., cells configured to remove excess deposition from the perimeter, and optionally, the backside of a substrate after a deposition process has been completed. An exemplary bevel cleaning cell is described in commonly assigned U.S. patent application Ser. No. 10/826,492, entitled "Integrated Bevel Clean Chamber," filed on Apr. 16, 2004, now U.S. Pat. No. 7,520,939 which is hereby incorporated by reference in its entirety to the extent not inconsistent with the present invention. Embodiments of the invention further contemplate that processing cell locations 106, 108 may be omitted from system 100, if desired. Additionally, processing cell locations 106, 108 may be configured as electroless processing cells or cell pairs, as will be further discussed herein.

Processing cell locations 102, 104 and 110, 112 may be configured as electroless processing cells. The electroless processing cells 102, 104, 110, 112 may be positioned on the mainframe 113 within processing enclosures 302 in a configuration where two processing cells are positioned in each processing enclosure 302, i.e., processing cells 110 and 112 may operate as a first and second processing cells in a first processing enclosure 302, and processing cells 102 and 104 may operate as a third and fourth processing cells 302 in a second processing enclosure 302. Additionally, as noted above, embodiments of the invention contemplate that processing cell locations 106 and 108 may have a processing enclosure 302 positioned over the processing cell locations 106, 108, and these processing cell locations 106, 108 may be configured to operate in similar fashion to processing cell locations 102, 104, 110, 112, if desired.

The electroless processing cells positioned in the processing enclosures 302 may include plating or plating support cells, e.g., electrochemical plating cells, electroless plating cells, electroless activation cells, and/or substrate rinse or clean cells. In the exemplary electroless processing system 100, one fluid processing cell in each pair of cells on platform 100 will be an activation cell and the other processing cell of the pair will be an electroless deposition cell. This configuration will generally be duplicated on the opposing side of the platform 100 in the opposing processing enclosure 302. For example, although the invention is not limited to any particular configuration, processing cell location 102 may be configured as an electroless activation cell, while processing cell location 104 is configured as an electroless deposition cell. Similarly, processing cell location 112 may be configured as an electroless activation cell, while processing cell location 110 is configured as an electroless deposition cell. The processing cells in the respective processing enclosures 302 generally operate independently from each other under the control of system controller 111.

Figure 2:
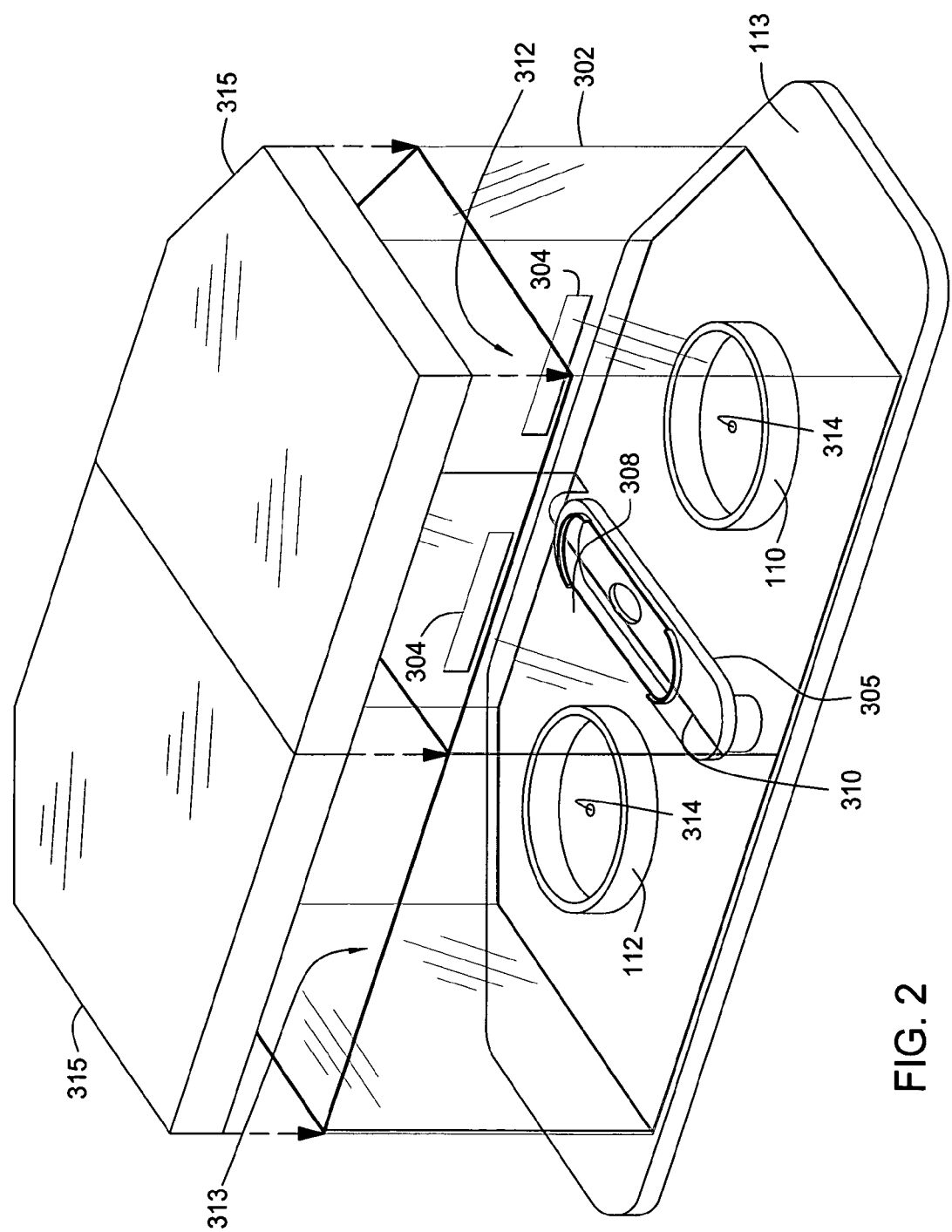
FIG. 2 is a perspective view of an exemplary deposition system.

FIG. 2 is a perspective view of an exemplary deposition system with the hardware of the processing cell locations 110, 112 omitted for clarity. An enclosure 302 defines a controlled processing environment around the pair of processing cell locations 110, 112. The processing enclosure 302 may include a central interior wall 308 that generally bisects the processing volume into two equally sized processing volumes 312, 313. Although the central interior wall 308 is optional, when it is implemented, the central interior wall 308 generally creates a first processing volume 312 above processing cell location 110 and a second processing volume 313 above processing cell location 112. The first and second processing volumes 312, 313 are substantially isolated from each other by the central interior wall 308, however, a lower portion of the central interior wall 308 includes a notch or slot 310 formed therein. The notch 310 is sized to accommodate a substrate transfer shuttle 305 that is positioned between processing cell locations 110, 112. The substrate transfer shuttle 305 is generally configured to transfer substrates between the respective processing cells (110, 112) without requiring the use of the mainframe robot 120. Substrate transfer shuttle 305 may be a vacuum chuck-type substrate support member that is configured to pivot about a point such that a distal substrate supporting end of the shuttle 305 moves in the direction of arrow 303 (shown in FIG. 1) to transfer substrates between the respective processing cell locations 110, 112. Each of the respective processing volumes 312, 313 also includes a valved port 304 that is configured to allow a robot, such as mainframe robot 120 to access the respective processing volumes 312, 313 to insert and remove substrates therefrom.

Each of the respective processing volumes 312, 313 also includes an environmental control assembly 315 (shown in FIG. 2 removed from contact with the processing enclosure for clarity) positioned on an upper portion of the respective. enclosures 312, 313. The environmental control assembly 315 includes a processing gas source configured to provide a processing gas to the respective processing volumes 312, 313. The processing gas source is generally configured to provide a controlled volume of an inert gas, such as nitrogen, helium, hydrogen, argon, and/or mixtures of these or other gases commonly used in semiconductor processing, to the respective processing volumes 312, 313. The environmental control assembly 315 further includes a particle filtration system, such as a HEPA-type filtration system. The particle filtration system is used to remove particulate contaminants from the gas flow entering the processing volumes 312, 313. The particle filtration system is also used to generate a generally linear and equal flow of the processing gas toward processing cell locations below. The environmental control assembly 315 may further include devices configured to control humidity, temperature, pressure, etc. in the respective processing volumes 312, 313. The controller 111 may be used to regulate the operation of the environmental control assembly and exhaust port 314, along with other components of the processing system 100, to control the oxygen content within the processing volumes 312, 313 in accordance with either a processing recipe or inputs received from sensors or detectors (not shown) positioned in the processing volumes 312, 313.

In operation, the processing gas is generally provided to the processing volumes 312, 313 by the environmental control assembly 315. The introduction of the processing gas into the respective processing volumes 312, 313 operates to fill the interior of the enclosed processing environment with an inert gas, thus purging the interior of processing volumes 312, 313 of gases that may degrade the electroless plating process, such as oxygen, for example. Generally, the processing gas source introduces the processing gas into the processing volumes 312, 313 near the top or upper portion of the processing volumes 312, 313 above the processing cell locations 110, 112 and near the center of the respective processing volumes 312, 313. The processing gas is generally introduced into the processing volumes 312, 313 through a HEPA-type filtration system configured to minimize airborne particles and equalize both the flow rate and direction of the processing gas such that the gas is flowing linearly and at a continuous flow rate toward the processing cell locations 110, 112.

Each of the processing cell locations 110, 112 also includes at least one exhaust port 314 (or multiple radially positioned ports 314 if desired) positioned to facilitate uniform flow of the processing gas from the gas supply in the environmental control assembly 315 toward the processing cell locations 110, 112. The exhaust port 314 may be positioned below the substrate being processed at the respective processing locations 110, 112, or alternatively, the exhaust port 314 may be positioned radially outward from the respective processing locations 110, 112. Regardless of positioning, the exhaust port 314 is configured to facilitate uniform flow of the processing gas while optionally evacuating fluid and chemical vapors from the respective processing locations 110, 112.

A typical process for supplying the inert gas to the processing volumes 312, 313 includes supplying the inert gas at a flow rate of between about 10 slm and about 300 slm, or more particularly, between about 12 slm and about 80 slm. The flow rate of the inert gas may be reduced when the respective processing volumes 312, 313 are closed, i.e., when the valved access ports 304 are closed. When the valved ports 304 are open, i.e., when substrates are being transferred into or out of the processing enclosure 302, the processing gas flow rate is increased to create an outflow of gas from the processing enclosure 302. This outflow of gas is configured to prevent ambient gases, and in particular oxygen, from entering into the interior of the processing enclosure. Once the valved ports 304 are closed, the processing gas flow rate may be decreased to a flow rate that accommodates substrate processing. This flow rate may be maintained for a period of time prior to initiating substrate processing, so that any incoming oxygen may be removed from the processing volumes 312, 313 prior to initiating a processing sequence. The exhaust port 314 works cooperatively with the processing gas supply to remove oxygen from the processing volumes 312, 313. The exhaust port 314 is generally in communication with a standard fabrication facility exhaust system and is used to remove processing gases from the processing volumes 312, 313. In alternative embodiments of the invention, the processing volumes 312, 313 may include a vacuum pump positioned in fluid communication with the processing volumes 312, 313. The vacuum pump may be used to further reduce the presence of unwanted gases in the processing volumes 312, 313. Regardless of the exhaust or pump configurations, the environmental control assemblies 315 are generally configured to maintain the oxygen content in the interior of the processing volumes 312, 313 below about 500 ppm during substrate processing, and more particularly, below about 100 ppm during substrate processing.

The combination of the environmental control assembly 315, the exhaust port 314, and the system controller 111 also allows system 100 to control the oxygen content of the processing volumes 312, 313 during specific processing steps, wherein one processing step may require a first oxygen content for optimal results and a second processing step may require a second oxygen content for optimal results, where the first and second oxygen contents are different from each other. In addition to the oxygen content, controller 111 may be configured to control other parameters of the processing enclosure, such as temperature, humidity, pressure, etc. as desired for a particular processing sequence. These specific parameters may be modified by heaters, chillers, humidifiers, dehumidifiers, vacuum pumps, gas sources, air filters, fans, etc., all of which may be included in the environmental control assembly 315 and positioned in fluid communication with the processing volumes 312, 313 and controlled by the system controller 111.

The processing volumes 312, 313 are generally sized to facilitate electroless plating processes, i.e., processing volumes 312, 313 are sized such that the gas supply of the environmental control assembly 315 can maintain a low oxygen content (generally less than about 500 ppm, or more particularly, less than about 100 ppm) during a processing step, while also allowing for sufficient volume to support evaporation of fluid solutions in the volume without vapor saturation of the processing volumes 312, 313. As such, the vertical distance from the upper surface of the substrate-positioned in one of the processing locations 110, 112 to the top of the processing volume 312, 313 across the area of the processing location (this volume is generally referred to as the head space) is generally between about 6 inches and about 40 inches high and has the diameter or cross section of the processing location 110, 112. More particularly, the head space may be between about 12 inches and about 36 inches in height, and the horizontal dimension of the processing volumes 312, 313 generally approximates the perimeter of the respective processing locations 110, 112, which are generally sized to be between about 10% and about 50% larger than the diameter of the substrates being processed in the respective processing locations 110, 112. These dimensions are important to the operation of the apparatus of the invention, as it has been shown that smaller processing volumes are prone to vapor saturation, which has a negative impact on electroless plating processes. As such, the inventors have determined that adequate head space (the cross sectional area of the processing location over the distance from the substrate to the top of the enclosure) is important to prevent vapor saturation and defects that may be associated therewith.

In terms of volume of head space generally required to prevent vapor saturation, the inventors have found that the head space for each processing location 110, 112 will generally be between about 1000 in$^3$ and about 5000 in$^3$ for a 300 mm processing location. As such, the head space for the processing volumes 312, 313 of the invention when configured for 300 mm substrate processing will generally be between about 1500 in$^3$ and about 5000 in$^3$, or between about 2000 in$^3$ and about 4000 in$^3$, or between about 2000 in$^3$ and about 3000 in$^3$, for example.

While the processing volumes 312, 313 are generally isolated from each other, the slot 310 allows for gases in one processing volume to pass into the adjacent processing volume. As such, embodiments of the invention provide for a higher pressure in one processing volume than in the adjacent processing volume. This pressure differential allows for control over the cross talk between the respective processing volumes 312, 313, as the gas flow between the processing volumes will be in the same direction and at the same rate if the pressure differential is maintained. Accordingly, one of the processing cells can be configured as a cool processing cell, such as an activation cell, and the other processing cell can be configured as a heated processing cell, such as an electroless deposition cell. In this embodiment, the heated processing cell is pressurized to a higher pressure, and as such, the heated fluid processing cell is always flowing gases through the slot 310 into the cooler fluid processing cell. This configuration prevents the cooler processing cell from reducing the temperature of the heated processing cell, as the heated processing cell, i.e., the electroless deposition cell, is generally more susceptible to defects as a result of temperature variation than cooled fluid processing cell, i.e., the activation cell.

In another embodiment, the respective processing volumes 312, 313 may be completely isolated from each other by the central interior wall 308, i.e., substrate shuttle 305 and wall slot 310 are removed. In this embodiment, the mainframe robot 120 may be used to service or access each of the isolated processing volumes 312, 313 individually via the respective access valves 304 and may operate to transfer substrates between the respective processing volumes 312, 313.

Figure 3:
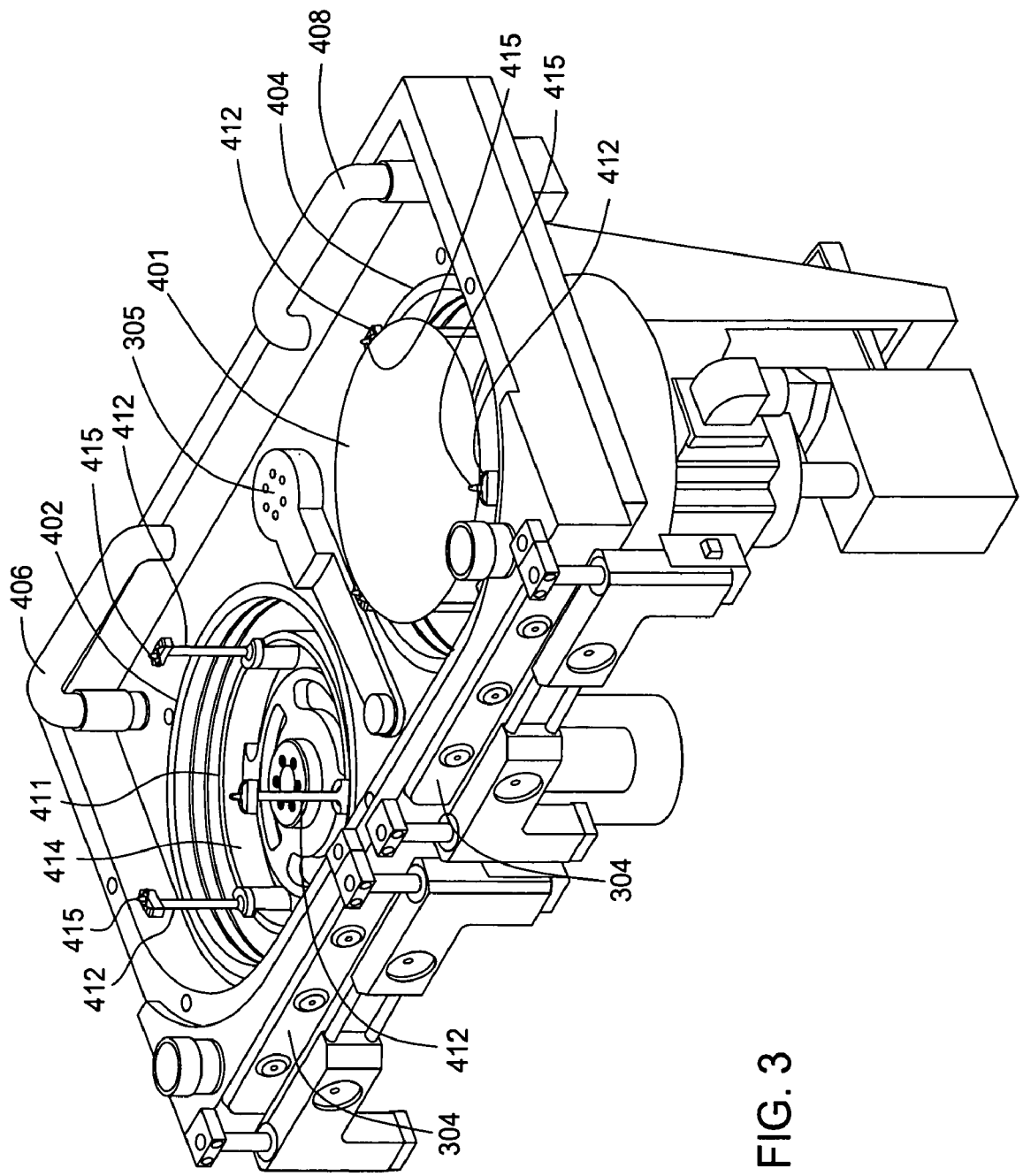
FIG. 3 is a perspective view of an exemplary deposition system with the enclosure removed.

FIG. 3 is a perspective view of an exemplary deposition station 400 with the enclosure 302 removed therefrom. The deposition station 400 generally represents an embodiment of the processing cells illustrated in FIGS. 1 and 2. The processing cells illustrated in deposition station 400 may be an electroless activation station 402 and an electroless deposition station 404. The substrate transfer shuttle 305 is positioned between stations 402, 404 and is configured to transfer substrates between the respective stations 402, 404. Each of stations 402, 404 includes a rotatable substrate support assembly 414 that is configured to support a substrate 401 for processing in the respective station in a face up orientation, i.e., the processing surface of the substrate 401 is facing away from the support assembly 414. In FIG. 3, station 402 does not have a substrate 401 illustrated on the substrate support assembly 414, while station 404 has a substrate 401 supported on the support assembly 414 to show the respective stations in both a loaded and empty states. Generally, the hardware configuration of the respective stations 402, 404 will be the same, however, embodiments of the invention are not limited to configurations where the stations 402, 404 have identical hardware therein. For example, the inventors contemplate that the deposition station 404 may have a temperature controlled platen 403, which is further described herein, while the activation station 402 may be configured without the temperature controlled platen 403.

Figure 4:
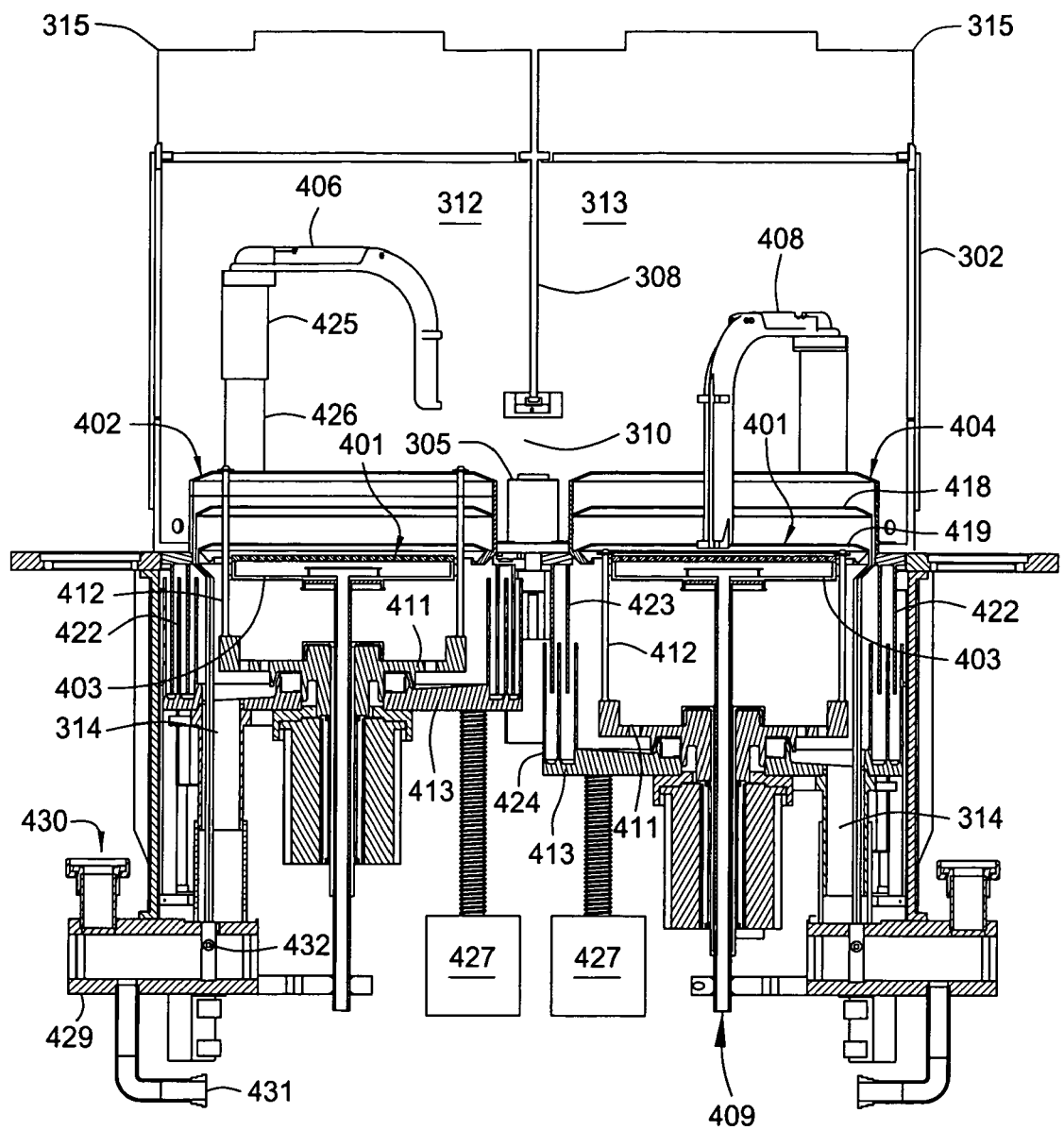
FIG. 4 is a sectional view of an exemplary deposition system.

The substrate support assembly 414, which is also shown in the sectional view of FIG. 4, includes a support ring structure 411 having a plurality of vertically extending substrate support fingers 412 extending therefrom. The substrate support fingers 412 generally include an upper horizontal surface configured to support an edge or bevel of a substrate 401, as generally illustrated at processing location 404 in FIG. 3 and in the sectional view of FIG. 4. The substrate support fingers 412 may further include a vertical post member 415 positioned to center the substrate 401 on the respective fingers 412. The substrate support assembly 414 further includes a lift assembly 413, which is illustrated and further described herein with respect to FIG. 4, that is configured to vertically actuate ring 411, and thus fingers 412, to load and unload substrates 401 from the respective stations 402, 404.

The respective stations 402, 404 each include a fluid dispensing arm 406, 408 that is configured to pivot over the substrate 401 during processing to dispense a processing fluid onto the front side or production surface of the substrate 401. The fluid dispensing arms 406, 408 may also be configured to be positioned vertically with respect to the substrate, i.e., the fluid dispensing portion of the arms 406, 408 may be positioned between about 0.5 mm and about 30 mm, or more particularly, between about 5 mm and about 15 mm, or between about 4 mm and about 10 mm from the surface of the substrate 401 being processed. The vertical and/or angular position of the fluid dispensing portion of the arms 406, 408 may be adjusted during processing of a substrate if desired. The dispensing arms 406, 408 may include more than one fluid conduit therein, and as such, the dispensing arms 406, 408 may be configured to dispense multiple fluid solutions therefrom onto the substrate 401.

Exemplary solutions that may be dispensed by either arm 406 or arm 408 include rinsing solutions, cleaning solutions, activating solutions, electroless plating solutions, and other fluid solutions that may be necessary to support an electroless deposition process. Additionally, the fluid conduits (not shown) in the respective arms 406, 408 may be heated/cooled to control the temperature of the fluids dispensed therefrom. Heating/cooling in the arm conduits provides advantages, namely, that the fluid does not have time to cool before being dispensed onto the substrate while traveling through the conduits. This configuration, therefore, operates to improve electroless deposition uniformity, which is dependent upon temperature. Further, the terminating end of the fluid dispensing arms 406, 408, i.e., the location where the processing fluid is dispensed, is movably positioned in embodiments of the invention. As such, the spacing between the fluid dispensing portion of the arms 406, 408 and the substrate surface may be adjusted. This spacing operates to minimize splashing of the processing solutions and allows for control over the positioning of the fluid dispensing operations onto the production surface. One embodiment, of a method and apparatus for dispensing fluids is disclosed below.

FIG. 4 is a sectional view of an exemplary pair of processing stations 402, 404. The sectional view of FIG. 4 also shows the enclosure 302 that defines the first and second processing volumes 312, 313 that are divided by the central interior wall 308, as described above with respect to FIG. 2. Each of the processing stations 402, 404 includes a substrate processing platen assembly 403 that forms a substantially horizontal upper surface configured to be positioned immediately below a substrate during processing. The platen assembly 403, which is also illustrated in the detailed sectional view of FIG. 5, collectively includes a fluid diffusion member 405 positioned over a base plate member 417 such that the fluid diffusion member 405 and the base plate member 417 form a fluid volume 410 therebetween. A fluid supply conduit 409 is in fluid communication with the fluid volume 410, and a fluid flow baffle 416 is attached to the base plate member 417 and is positioned in the fluid volume 410 between the terminating end of the supply conduit 409 and a lower surface of the fluid diffusion member 405.

The fluid diffusion member 405 includes a plurality of fluid holes 407 formed therethrough that connect an upper surface of the fluid diffusion member 405 to a lower surface of the fluid diffusion member 405. A perimeter portion of the fluid diffusion member 405 is generally in sealed communication with the base plate member 417, and as such, fluid may be introduced into the fluid volume 410 by fluid supply conduit 409 and caused to flow through the holes 407 formed in the diffusion member 405 as a result of the increasing fluid pressure generated in the sealed fluid volume 410 by the fluid introduction.

The fluid diffusion member 405 may include between about 10 and about 200 fluid holes 407 that generally have a diameter of between about 0.5 mm and about 15 mm, or more particularly, a diameter of between about 0.7 mm and about 3 mm. The holes 407 may be positioned vertically, or alternatively, at an angle with respect to the upper surface of the diffusion member 405. The holes 407 may be positioned at an angle of between about 5° and about 45° from vertical to facilitate an outward fluid flow pattern across the surface of the diffusion member 405. Further, the angled holes 407 may be configured to reduce fluid turbulence.

In another embodiment of the invention, the fluid diffusion member 405 may comprise a porous material, such as a porous ceramic, for example, configured to allow fluid to flow therethrough. In this embodiment, the holes 407 are generally not required, however, the inventors have contemplated implementing some holes 407 in conjunction with the porous fluid diffusion member 405 to increase fluid flow where necessary. Ceramic materials may be advantageous since they are naturally hydrophilic and can be substantially rigid. In one aspect, the diffusion member 405 may be designed with pores having dimensions from about 0.1 micrometers to about 500 micrometers. Since the fluid flow resistance through the diffusion member 405 is a function of the thickness of the diffusion member 405, this feature can be varied or altered to provide desired fluid flow characteristics as needed.

In another embodiment of the invention, the base plate 417 may have a plurality of fluid supply conduits 409 formed therethrough, wherein each of the fluid supply conduits 409 is configured to supply fluid to individual and/or particular holes 407. More particularly, this embodiment may be used to implement a zoned fluid supply system, wherein separate heated fluids are supplied to different areas of the backside of the substrate via individual or groups of holes 407, thus providing control over the temperature variation across the substrate as a result of the position of the individual holes 407 and the temperature of the heated fluid flowing through the individual holes 407. This embodiment may be used to generate increased temperatures near the center or edge of the substrate during processing, for example.

The base plate 417 and diffusion member 405 may be manufactured from a ceramic material (such as fully pressed aluminum nitride, alumina $Al_2O_3$, silicon carbide (SiC)), a polymer coated metal (such as Teflon™ polymer coated aluminum or stainless steel), a polymer material, or other material suitable for semiconductor fluid processing. Preferred polymer coatings or polymer materials are fluorinated polymers such as Tefzel (ETFE), Halar (ECTFE), PFA, PTFE, FEP, PVDF, etc. A more detailed description of the configuration, components, and operation of the fluid processing cell 500 of the invention may be found in commonly assigned U.S. patent application Ser. No. 10/680,325, filed on Oct. 6, 2003, entitled "Apparatus to Improve Wafer Temperature Uniformity for Face-up Wet Processing", which is hereby incorporated by reference in its entirety to the extent not inconsistent with the present invention.

In operation, a substrate 401 is secured by the fingers 412 and is vertically positioned just above the fluid diffusion member 405. The space between the fluid diffusion member 405 and the substrate 401 is filled with a temperature controlled fluid dispensed by conduit 409 through diffusion member 405. The fluid contacts the backside of the substrate 401 and transfers heat thereto to heat the substrate. In this embodiment, the substrate is generally positioned in parallel relationship to the upper surface of the diffusion member 405 and between about 0.1 mm and about 15 mm away from the upper surface of the diffusion member 405, and more particularly between about 0.5 and about 2 mm away from the upper surface of the diffusion member 405.

In another embodiment of the invention, the interior of the platen assembly 403 may include a heater 433, which may be a resistive-type heater that is configured to increase the temperature of the platen assembly 403 to heat the substrate 401 being processed. Similarly, the fluid conduit 409 and/or the fluid supply may include a heating device configured to heat the fluid passing through the conduit 409 prior to the fluid contacting the substrate 401 positioned on the support fingers 412. The heaters may be in communication with the system controller 111, such that the controller 111 may regulate the operation of the respective heaters to control the temperature of the fluid and the substrate being processed.

The process of positioning a substrate 401 for processing generally involves moving the lift assembly 413 between a loading position and a processing position. The lift assembly 413 is illustrated in a loading position in the left processing station 402 of FIG. 4, where the lift assembly is in a vertical position such that support fingers 412 extend above upper catch ring 418. In this position, the fluid dispensing arm 406 is vertically spaced above the fingers 412 to allow for loading of a substrate 401. The arm 406 (and the other fluid dispensing arms of the deposition system) includes a stationary base member 426 that telescopically receives an upper arm member 425. A drive motor telescopically moves that upper arm member 425 relative to the base member 426 to adjust the vertical position of the arm 406. The substrate 401 is positioned above the support fingers 412 by the mainframe robot 120 or the substrate shuttle 305, and then the fingers 412 may be vertically actuated to remove the substrate 401 from the respective robot/shuttle 120, 305. Once the substrate 401 is supported by the fingers 412 above the robot/shuttle 120, 305, then the robot/shuttle 120, 305 may be removed from below the substrate 401, and the fingers 412 may be lowered into a processing position.

The lift assembly 413 is illustrated in a processing position in the right processing station 404 of FIG. 4, where the lift assembly 413 is vertically positioned such that the fingers 412 position the substrate 401 at a vertical position proximate one of the catch rings 418, 419. In the processing position, the fluid dispensing arm 408 is lowered and positioned proximate the upper surface of the substrate 401, as illustrated at processing station 404 in FIG. 4. The lift assembly 413 is generally actuated by a powered jack screw assembly 427 configured to vertically actuate the lift assembly 413 and the components attached thereto. More particularly, the lower portion of the fluid processing cell is attached to the lift assembly 413 and moves cooperatively therewith. The lower portion of the processing cell generally includes the substrate support assembly 414 (including fingers 412 and ring 411), the lower interleaving walls 424, and the exhaust 314. The platen assembly 403 remains stationary and does not move concomitantly with the lift assembly 413.

Figure 6:
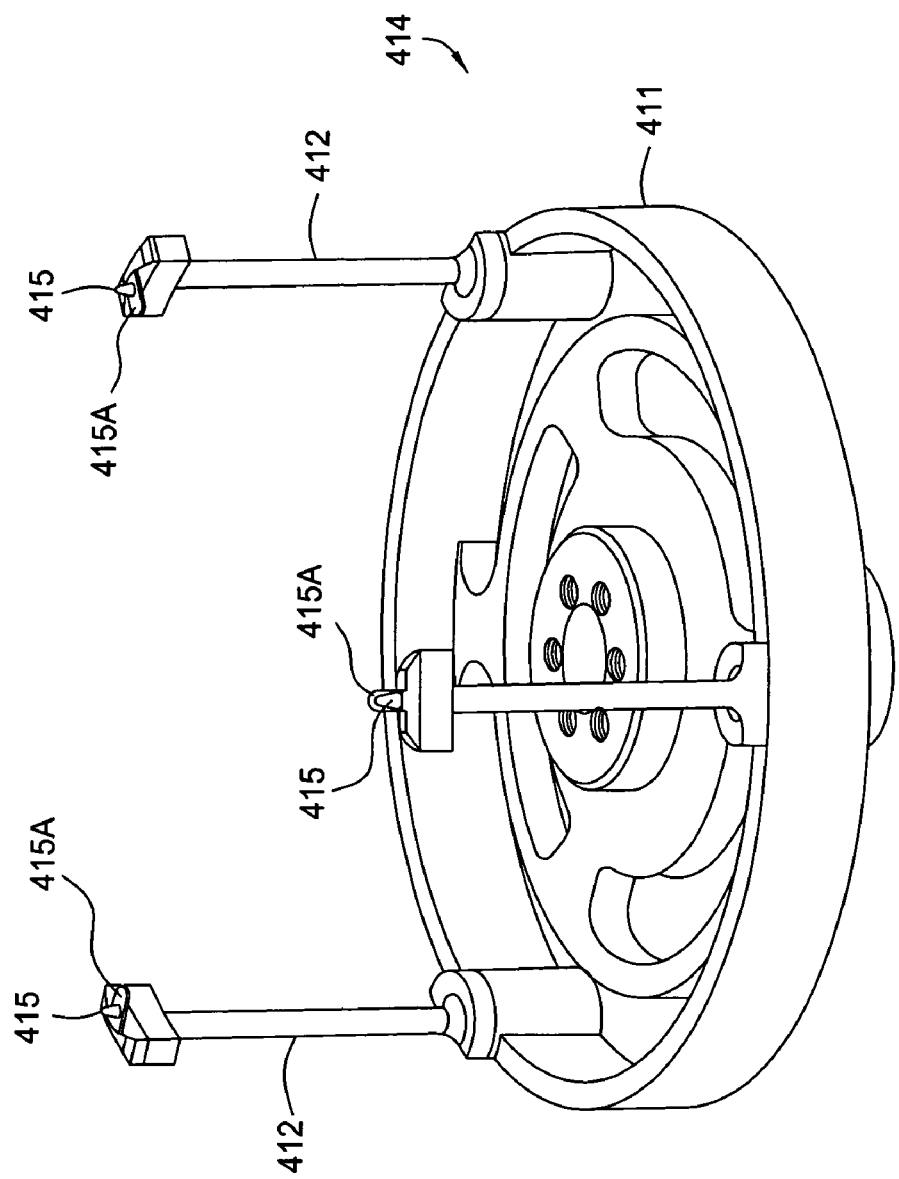
FIG. 6 is a perspective view an exemplary substrate support assembly.

Referring to FIG. 6, the substrate support assembly 414 generally contains the fingers 412, vertical post member 415, substrate supporting surface 415A, and ring 411. A substrate that is placed on the substrate supporting surface 415A is captured or retained by the vertical post members 415. In one aspect of the invention, the substrate support assembly 414 is designed so that thermal expansion of the various components will not affect the ability of the substrate support assembly 414 to retain a substrate resting on the substrate supporting surface 415A. Thermal expansion of the substrate support assembly 414 can lead to misplacement and/or damage to the substrates placed between the vertical post members 415. One method of reducing thermal expansion is to design the substrate support assembly 414 using materials that have a low coefficient of thermal expansion, for example, tungsten, alumina, or boron carbide. In another aspect, the ring 411 may be designed to have a geometry that will minimize the movement of the fingers 412 and vertical post members 415.

The lower portion of each of the respective processing stations 402, 404 each includes a plurality of interleaving wall assembly 422. The interleaving wall assembly 422 is configured to cooperatively move with the lift assembly 413 between the loading position illustrated at location 402 in FIG. 4 and the processing position illustrated at location 404 in FIG. 4. The interleaving wall assembly 422 generally includes upper interleaving walls 423, which are rigidly attached to the mainframe 113, and lower interleaving walls 424, which are attached to the lift assembly 413 and configured to move therewith. The lower interleaving walls 424 (specifically the innermost pair of walls 424 positioned closest to the cell) may be filled with a fluid, such as deionized water, that operates to seal the lower portion of the processing stations 402, 404 from the environment outside of the enclosed environment. The deionized water is generally continually supplied to the space between the lower interleaving walls 424 through a drip mechanism, for example. The use of the fluid sealing interleaving wall assembly 422 allows the processing stations 402, 404 of the invention to decouple the rotational seal 428 of the stations 402, 404 from the vertical seal of the stations, i.e., in conventional cells both the rotational and vertical seals were positioned on a common shaft, such as conduit 409 in the present invention. The interleaving wall assembly 422 allows the seal 428 illustrated in FIG. 7 to be only a rotational seal, and not a combination of a rotational seal and a vertical sliding seal, which are difficult to operate in fluid processing systems.

Figure 5:
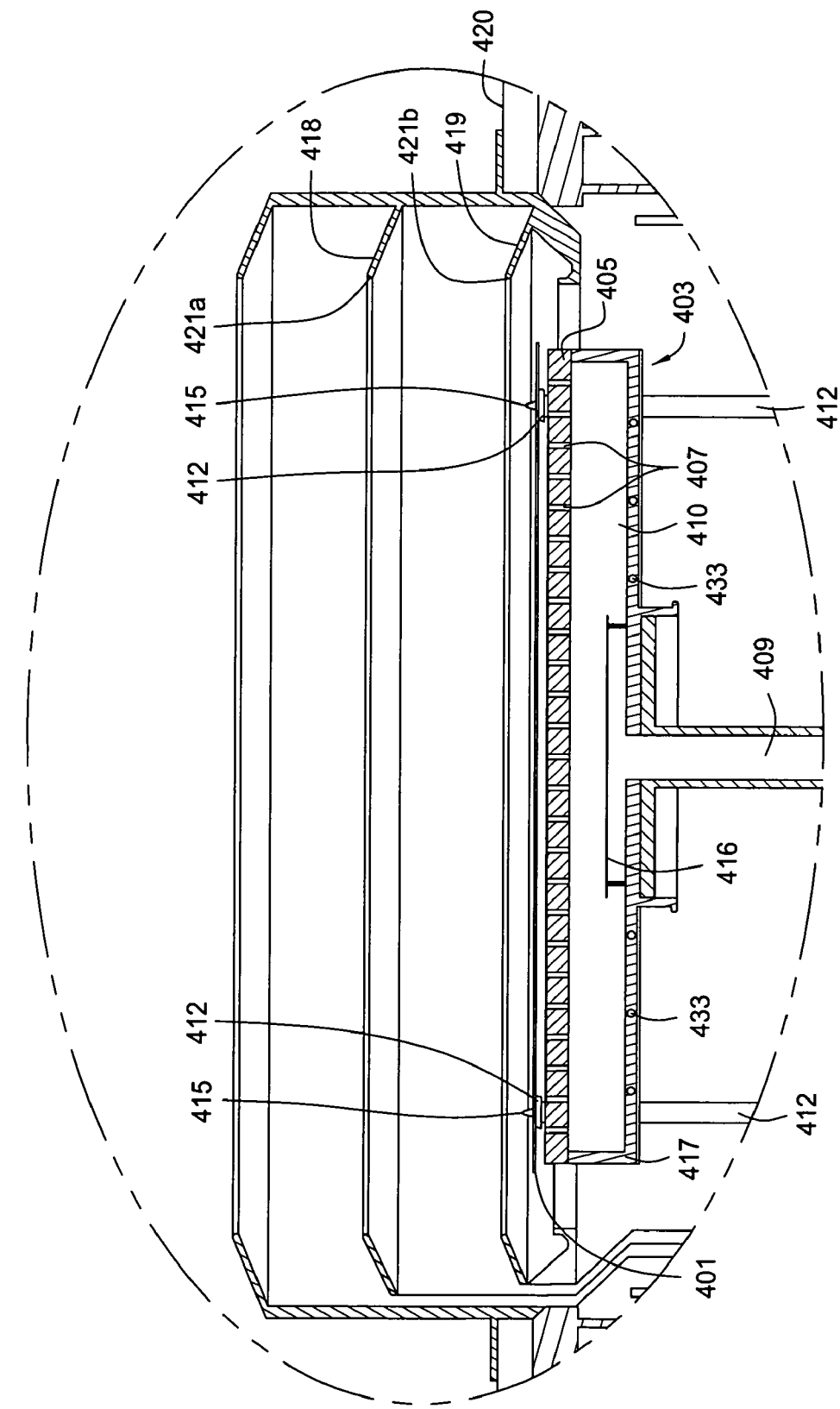
FIG. 5 is a sectional view of an exemplary fluid processing station.
Figure 7:
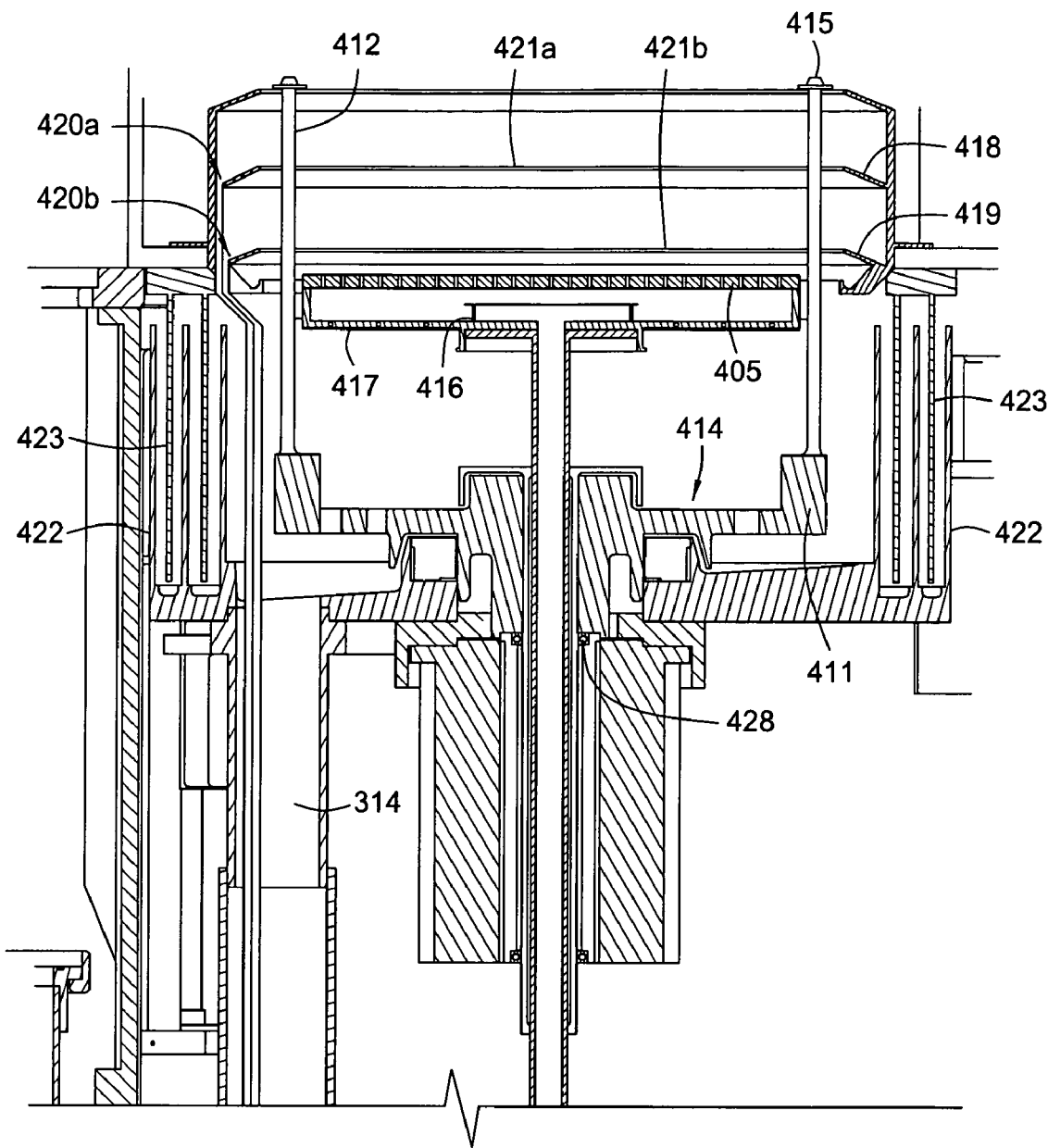
FIG. 7 is a sectional view of an exemplary fluid processing station.

As noted above, each of the stations 402, 404 may also include an upper fluid catch ring 418 and a lower fluid catch ring 419, as illustrated in FIGS. 4, 5 and 7. The respective catch rings 418, 419 generally comprise annularly shaped members that extend inwardly and upwardly from an inner wall of the respective stations 402, 404. The rings 418, 419 may be attached to the inner wall of the cells or may be an integral part of the inner wall of the cells. The inner terminating edge 421a, 421b of catch rings 418, 419 is generally sized to have a diameter that is between about 5 mm and about 50 mm larger than the diameter of the substrate 401 being processed. As such, the substrate 401 may be vertically raised and lowered through the respective rings 418, 419 during processing. Additionally, each of the catch rings 418, 419 also includes a fluid drain 420a, 420b respectively, configured to collect processing fluids landing on the fluid catch rings 418, 419 (see FIG. 7). The fluid drains 420a, 420b are in fluid communication with the exhaust port 314, as shown in FIG. 7. The exhaust port 314 connects to a separation box 429, where the gases and fluids may be separated from each other. Separation box 429 includes a gas exhaust port 430 positioned on an upper portion of the box 429, and a fluid exhaust 431 positioned on a lower portion of the box. Separation box 429 further includes a recapture port 432 that is configured to communicate processing fluids collected on catch rings 418, 419 to a reclamation device for reuse.

Referring to FIG. 7, the catch rings 418 and 419 are configured to allow for fluid processing of a substrate 401 at multiple vertical locations within each of the processing stations 402, 404. For example, a substrate 401 may be positioned such that the upper surface of the substrate 401 is positioned slightly above the terminating end 421a of the upper catch ring 418 for a first fluid processing step. A first processing fluid may be dispensed onto substrate 401 by a fluid dispensing arm 406, 408 while the substrate 401 is rotated at between about 5 rpm and about 120 rpm. The rotation of the substrate 401 causes the fluid dispensed onto the substrate to flow radially outward off of the substrate. As the fluid flows over the edge of the substrate is travels outward and downward and is received on the upper catch ring 418. The fluid may be captured by the fluid drain 420a and recirculated for subsequent processing if desired.

Once the first fluid processing step is complete, the substrate 401 may be vertically moved to a second processing position where the upper surface of the substrate 401 is positioned slightly above the terminating end 421b of the lower catch ring 419 for a second fluid processing step. The substrate 401 is processed in this position in similar fashion to the first fluid processing step and the fluid used in the process may be collected by a fluid drain 420b. An advantage of this configuration is that multiple fluid processing chemistries may be used in a single processing station. Additionally, the fluid processing chemistries may be compatible or incompatible, as the separate fluid catch rings 418, 419 that each have independent fluid drains 420a, 420b allows for separate collection of incompatible processing fluids.

In operation, embodiments of the deposition system 100 of the invention may be used to conduct an electroless preclean process, an electroless activation process, an electroless plating process, an electroless post clean process, and/or other processing steps that may be used in an electroless process. An exemplary process sequence for conducting an electroless plating process using embodiments of the invention will now be described with respect to the embodiments of the invention illustrated in FIGS. 1-5. An electroless plating process generally begins with the insertion of a substrate into the enclosed processing environment 302. The insertion process generally includes opening the valved access port 304 and inserting a substrate 401 into the processing environment 302 with the mainframe robot 120. The substrate 401 is inserted in a face up orientation, i.e., the surface of the substrate 401 to be plated is facing upward.

Once the substrate is inserted into the enclosed processing environment 302, the mainframe robot 120 positions the substrate onto the support fingers 412 in processing station 404, and the mainframe robot retracts from the processing enclosure 302. The fingers 412 may then vertically position the substrate 401 for processing, while valved access port 304 is closed. During the insertion process, i.e., during the time period when the valved access port 304 is open, the gas supply in the environmental control assembly 315 is on and is caused to fill the enclosed processing environment 302 with an inert processing gas. The process of flowing the inert gas into the processing volume causes an outward flow of the processing gas through the valved port 304 that is configured to prevent ambient gasses, oxygen in particular, from entering the enclosed processing environment 302, as oxygen is known to have a detrimental effect (oxidation) on plated materials, and in particular, copper. The flow of the processing gas is continued after the valved access port 304 is closed, and is generally on before the valved access port 304 is opened. The flow of processing gas is continued during the electroless cleaning, activation, and plating sequence and the exhaust port 314, a gas vent, and/or vacuum pump may be used to maintain a desired processing pressure in the enclosed processing environment 302 once the valved access port 304 is closed. The combination of the gas supply, a HEPA filter, and the exhaust port 314 are used to control the oxygen content in the enclosed processing environment 302 during particular processing steps, i.e., the oxygen content in the enclosure 302 may be controlled and optimized for each individual processing step if desired.

Once the substrate is positioned in the processing cell, the electroless plating processes of the invention generally begin with a substrate pre-cleaning process. The precleaning process begins with the upper surface of the substrate being positioned slightly above, generally between about 2 mm and about 10 mm, the terminating end 421*a* of the upper catch ring 418. The cleaning process is accomplished via a cleaning solution being dispensed onto the substrate surface by the fluid dispensing arm 406. The cleaning solution may be dispensed onto the substrate surface during the lowering process to save process time and increase throughput of the cell. The cleaning solution may be an acidic or basic solution, depending upon the desired cleaning characteristics, and the temperature of the cleaning solution may be controlled (heated or cooled) in accordance with a processing recipe. Additionally, the cleaning solution may include a surfactant additive. The rotation of the substrate, which is generally between about 10 rpm and about 60 rpm, causes the cleaning solution to flow radially outward off of the substrate and onto the upper catch ring 418, where the cleaning solution is captured, transmitted to drain 420*a*, and then communicated to separation box 429 via the exhaust port 314 for separation and recycling, if desired.

Once the substrate has been cleaned, the substrate surface is generally rinsed. The rinsing process includes dispensing a rinsing solution, such as deionized water, onto the substrate surface while rotating the substrate. The rinsing solution is dispensed at a flow rate and temperature configured to effectively remove any residual cleaning fluid from the substrate surface. The substrate is rotated at a speed sufficient to urge the rinsing solution off of the surface of the substrate, i.e., between about 5 rpm and about 120 rpm, for example.

Once the substrate has been rinsed, a second rinsing step may be employed. More particularly, prior to an activation step, which generally includes application of an acidic activation solution to the substrate surface, the substrate surface may first be treated with an acidic conditioning rinse solution. The conditioning rinse solution generally includes an acid, such as the acid used in the activation solution, for example, which operates to condition the substrate surface for the application of the acidic activation solution. Exemplary acids that may be used for conditioning solutions include nitric acid, chloride based acids, methyl sulfonic acids, and other acids commonly used in electroless activation solutions. The substrate conditioning process may be conducted at a processing position adjacent the upper catch ring 418, or the substrate may be lowered to a processing position adjacent the lower catch ring 419, depending upon the compatibility of the chemistry used for the conditioning process with the chemistry used for the pre-cleaning process.

Once the substrate has been conditioned, an activation solution is applied to the substrate surface with the substrate positioned proximate the lower catch ring 419. The activation solution is dispensed onto the substrate by arm 408 and is caused to flow radially outward over the edge of the substrate and onto the catch ring 419 as a result of the substrate being rotated. The activation solution is then collected by the fluid drain 420 for recirculation. The activation solution generally includes a palladium based solution having an acid foundation. During the activation step, the backside substrate surface, which is generally circular and similar in diameter to diffusion member 405, is generally positioned between about 0.5 mm and about 10 mm from the upper surface of the diffusion member 405. The space between the backside of the substrate and the diffusion member 405 is filled with a temperature controlled fluid, which may be deionized water that is dispensed from the fluid holes 407 formed into the diffusion member 405. The temperature controlled fluid (generally a heated fluid, but may also be a cooled fluid) dispensed from the holes 407 contacts the backside of the substrate and transfers heat to/from the fluid to the substrate to heat/cool the substrate for processing. The fluid may be continually supplied, or alternatively, a predetermined volume of the fluid may be supplied and then the fluid supply terminated. The flow of the fluid contacting the backside of the substrate may be controlled to maintain a constant substrate temperature during the activation process. Additionally, the substrate may be rotated at between about 10 rpm and about 100 rpm during the activation process to facilitate even heating/cooling and fluid spreading.

Once the substrate surface has been activated, an additional rinsing and/or cleaning solution may be applied to the substrate surface to clean the activation solution therefrom. A first rinsing and/or cleaning solution that may be used after activation includes another acid, preferably selected to match the acid of the activation solution. After the acid post rinse, the substrate may also be rinsed with a neutral solution, such as deionized water, to remove any residual acid from the substrate surface. The post activation cleaning and rinsing steps may be conducted at either the upper processing position or the lower processing position, depending upon the compatibility of the chemistries.

When the activation steps are completed, the substrate may be transferred from the activation station 404 to the deposition station 402 by the substrate shuttle 305. The transfer process includes raising the substrate out of the activation station 402 with the lift fingers 412, moving the shuttle 305 under the substrate, lowering the substrate onto the shuttle 305, and transferring the substrate from the activation station 404 to the deposition station 404. Once the substrate is in the deposition station 402, the substrate support fingers 412 for the deposition station 402 may be used to remove the substrate from the shuttle 305 and position the substrate for processing.

The positioning of the substrate generally includes positioning the substrate proximate the upper catch ring 418 for a pre-cleaning process. The precleaning process includes dispensing a precleaning solution onto the substrate with arm 408, wherein the precleaning solution is generally selected to have a similar pH as the electroless plating solution subsequently applied so that the precleaning solution may condition the substrate surface to the pH of the deposition solution. The precleaning solution may be a basic solution that is the same as the foundation for the electroless deposition solution that is to be applied after the conditioning step. The precleaning of the substrate surface with a solution having the same pH as the plating solution also improves the wetability of the substrate surface for the deposition process. The precleaning solution may be heated or cooled, as required by the processing recipe.

When the substrate surface has been conditioned by the basic solution, the next step in the electroless deposition process is to apply the plating solution to the substrate surface. The plating solution generally includes a metal, such as cobalt, tungsten, and/or phosphorous, etc. that is to be deposited onto the substrate surface in the form of a pure metal or an alloy of several metals. The plating solution is generally basic in pH and may include a surfactant and/or a reductant configured to facilitate the electroless plating process. The substrate is generally lowered to a position slightly above the lower catch ring 419 for the deposition step. As such, the deposition solution applied by arm 408 flows outward over the edge of the substrate and is received by the catch ring 419, where it may be collected by drain 420b for possible recycling. Additionally, the backside of the substrate is generally positioned between about 0.5 mm and about 10 mm, or between about 1 mm and about 5 mm away from the upper surface of the diffusion member 405 during the deposition step. The space between the backside of the substrate and the diffusion member 405 is filled with a temperature controlled (generally heated) fluid, which may be deionized water that is dispensed through the fluid holes 407 formed into the diffusion member 405. The temperature controlled fluid dispensed from the holes 407 contacts the backside of the substrate and transfers heat from the fluid to the substrate to heat the substrate for the deposition process. The fluid is generally continually supplied throughout the deposition process. The flow of the fluid contacting the backside of the substrate during the deposition process is controlled to maintain a constant substrate temperature during the deposition process. Additionally, the substrate may be rotated at between about 10 rpm and about 100 rpm during the deposition process to facilitate even heating and spreading of the deposition solution applied to the substrate surface.

Once the deposition process is completed, the substrate surface is generally cleaned in a post deposition cleaning process that includes applying a post deposition cleaning solution to the substrate. The post deposition cleaning process may be conducted at either the upper or lower processing position, depending upon the compatibility of the process chemistries. The post deposition cleaning solution generally includes a basic solution having about the same pH as the plating solution. The substrate is rotated during the cleaning process to urge the cleaning solution off of the substrate surface. Once the cleaning process is completed, the substrate surface may be rinsed, with deionized water, for example, and spun dry to remove any residual chemicals from the substrate surface. Alternatively, the substrate may be vapor dried via application of a solvent with a high vapor pressure, such as acetone, alcohols, etc.

In the exemplary processing system 100 of the invention, processing cell locations 102 and 112 may be configured to conduct an electroless preclean process, an electroless activation process, and an electroless post activation cleaning process, while processing cell locations 104, 110 may be configured as electroless deposition cells and electroless post deposition cleaning cells. In this configuration, reclamation of the chemistries from the respective processes is possible, as the respective activation and deposition chemistries are separated in the respective processing locations. Another advantage of this configuration is that the substrate is transferred from an activation solution to an electroless deposition solution in an inert environment, as the processing space for the fluid processing cell locations 102, 104, 110, 112 is within the enclosed processing environment 302. Further, the processing enclosure is flooded with an inert gas during loading and processing, and as such, the interior of the enclosed processing environment 302 has a substantially reduced percentage of oxygen, for example, less than about 100 ppm of oxygen, or more particularly, less than about 50 ppm of oxygen, or further still, less than about 10 ppm of oxygen. The combination of the substantially reduced oxygen content along with the close proximity and fast transfer times between the activation and plating cells (generally less than about 10 seconds) operates to prevent oxidation of the substrate surface between the activation and deposition steps, which has been a significant challenge for conventional electroless systems.

Throughout the fluid processing steps of the invention, the substrate position may be varied. More particularly, the vertical position of the substrate with respect to the fluid diffusion member 405 may be varied. The distance from the diffusion member 405 may be increased to lower the temperature of the substrate, for example, during processing if desired. Similarly, the proximity of the substrate to the diffusion member 405 may be decreased to increase the temperature of the substrate during processing.

Another advantage of embodiments of the invention is that the processing system 100 may be used with compatible or incompatible chemistries. For example, in a processing sequence that utilizes incompatible chemistries, e.g., acidic activation solutions and basic plating solutions, the acidic solutions will generally be exclusively used in one cell or station, while the basic solutions are exclusively used in another cell. The cells may be adjacently positioned and substrates may be transferred between the respective cells by one of the shuttles 305. The substrates are generally cleaned in each cell prior to being transferred to the adjacent cell, which prevents chemistry from one cell from contaminating another cell. Additionally, the multiple processing locations within each processing station or cell, e.g., the positioning of catch rings 418, 419 allows for the use of incompatible chemistries in a single cell or station, as the respective chemistries may be collected by different catch rings 418, 419 and kept separate from each other.

Embodiments of the invention may also be configured as single use-type chemistry cells, i.e., a single dose of the process chemistry may be used for a single substrate and then discarded without solution reclamation, i.e., without being used to process additional substrates. For example, processing system 100 may utilize common cells to activate, clean, and/or post process a substrate, while using other cells to conduct an electroless deposition and/or post-deposition cleaning process. Since each of these processes may utilize a different chemistry, the cell is generally configured to supply each of the required chemistries to the substrate when needed and drain the used chemistry therefrom once the process is completed. However, the cells are generally not configured to recapture the chemistries, as substantial contamination issues are presented by recapturing different chemistries from the single cell.

Additional processing cells that may be used in embodiments of the present invention may be found in commonly assigned U.S. Pat. No. 6,258,223, entitled "In-Situ Electroless Copper Seed Layer Enhancement in an Electroplating System", issued on Jul. 10, 2001, and commonly assigned U.S. patent application Ser. No. 10/036,321, entitled "Electroless Plating System", filed on Dec. 26, 2001, now U.S. Pat. No. 6,824,612 both of which are hereby incorporated by reference in their entireties to the extent not inconsistent with the present invention.

Spray Dispense System

Figure 8:
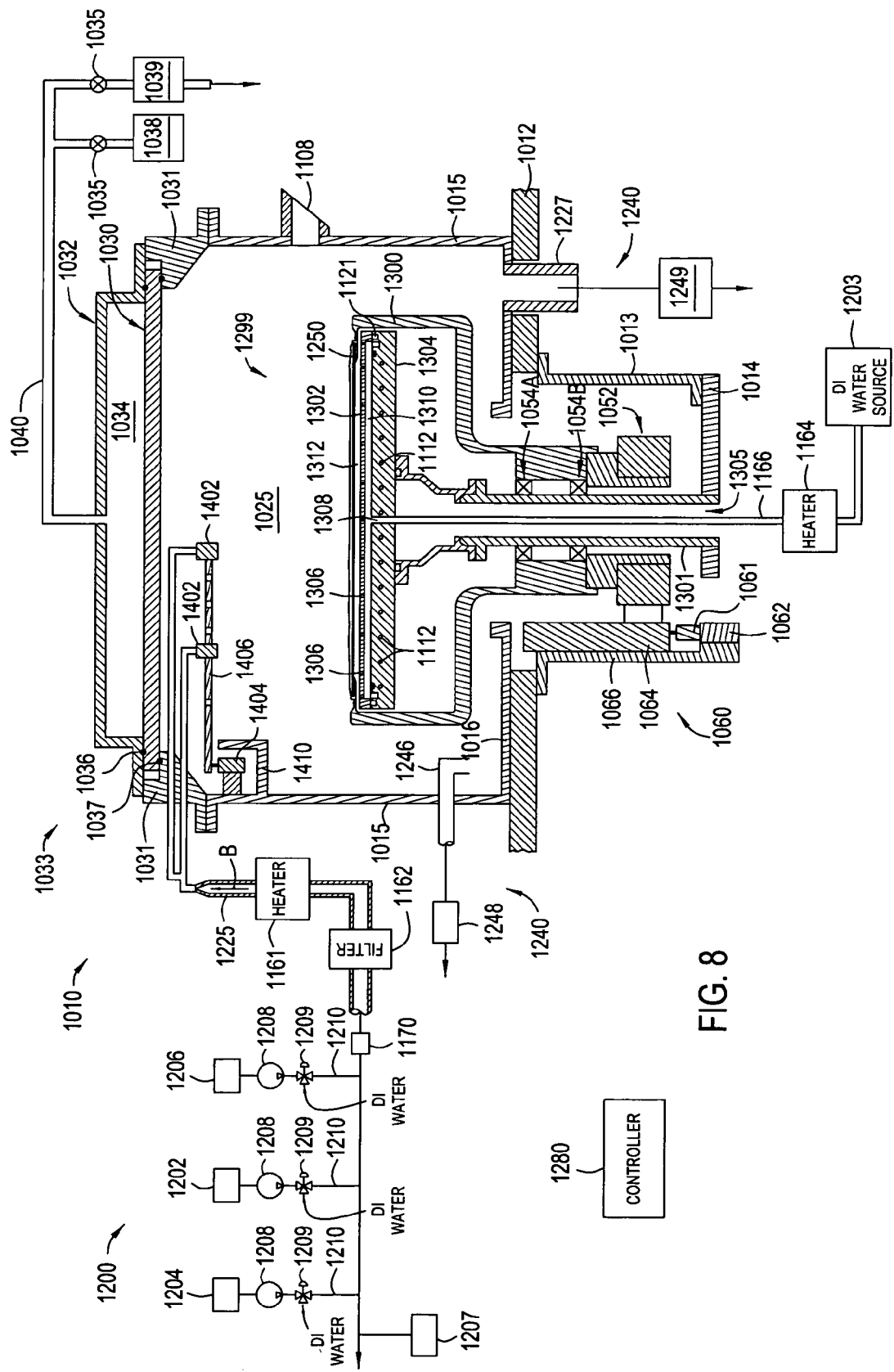
FIG. 8 provides a cross-sectional side view of a face-up, electroless processing chamber that utilizes nozzles disposed on a fluid delivery arm within the chamber. In addition, a substrate lift assembly is shown for selectively raising or lowering the substrate within the chamber. In this view, the substrate lift assembly is in its lowered position.

FIG. 8 illustrates a cross-sectional side view of one embodiment of a face-up, electroless processing cell 1010, which is similar to the respective stations 402, 404 described above. A substrate oriented face-up is seen at 1250 in FIG. 8. The term "electroless process" (or electroless deposition process) is meant to generally cover all process steps done to deposit an electroless deposited film onto a substrate including, for example, one or more of the pre-clean process steps (substrate preparation steps), the electroless activation process steps, the electroless deposition steps, and the post deposition cleaning and/or rinsing steps.

The electroless processing cell 1010 includes a cell body 1015. The cell body 1015 may be manufactured from various substances known to be nonreactive with fluid processing (electroless or ECP) solutions. Such substances include plastics, polymers, and ceramics. In the arrangement of FIG. 8, the cell body 1015 defines a circular body forming a radial side wall for the cell 1010. The cell body 1015 receives and supports a lid assembly 1033 at its upper end. An integral bottom wall 1016 is provided with the cell body 1015 along its bottom end. The bottom wall 1016 has an opening for receiving a substrate support assembly 1299. Features of the substrate support assembly 1299 are described below.

In one embodiment, the substrate support assembly 1299 generally includes a base plate member 1304, and a fluid diffusion member 1302 attached thereto. The substrate support assembly 1299 depicted in FIGS. 8-11, illustrates another embodiment of the platen assembly 403, described above. An annular seal 1121, such as an o-ring type seal, is positioned near the perimeter of the fluid diffusion member 1302. The annular seal 1121 is generally configured to engage the top, outer edge of the base plate member 1304 to create a fluid tight seal between the fluid diffusion member 1302 and the base plate member 1304 to facilitate the fluid delivery process.

The base plate member 1304 generally defines a solid disk shaped member having a fluid passage 1308 formed through a central portion thereof, or through another location on the plate 1304. The base plate 1304 is preferably fabricated from a ceramic material or a coated metal. A PVDF material may also be employed. A fluid volume 1310 is formed above the base plate member 1304 and below the fluid diffusion member 1302. In this manner, the fluid diffusion member 1302 is positioned above the base plate member 1304. The fluid volume 1310 may generally have a spacing between the fluid diffusion member 1302 and the base plate 1304 of between about 2 mm and about 15 mm; however, larger or smaller spacings may be used.

The fluid diffusion member 1302 includes a plurality of fluid passages 1306 formed there through. The fluid passages 1306 connect an upper surface of the fluid diffusion member 1302 to the fluid volume 1310. As noted, a perimeter portion of the fluid diffusion member 1302 is generally in sealed communication with the base plate member 1304. In this way, fluid may be introduced into the fluid volume 1310 via fluid inlet 1308. The fluids are caused to flow into the sealed fluid volume 1310 from the fluid passage 1308, then through the fluid passages 1306 formed in the diffusion member 1302, and into the heat transfer region 1312 between the backside of the substrate 1250 and the fluid diffusion member 1302.

In the arrangement of FIG. 8, a fluid source is seen at 1203. More specifically, the fluid source is deionized water. Fluid flows from the DI water source 1203 and through a substrate fluid heater 1164. The fluid heater 1164 warms the water to a desired temperature. The fluid heater 1164 as may be used herein can be any type of device that imparts energy into the processing fluid. Preferably the heater is a jacketed type resistive heater (e.g., heater heats the fluid through the wall of the inlet tubing) rather than an immersion type heater (e.g., heater element touches the solution). The heater 1164, used in conjunction with a process controller 1280 and temperature probe 1154 (not shown), can be utilized to assure that the temperature of the DI water entering the heat transfer region 1312 is at the desired temperature.

The DI water exits the heater, and flows through the tube 1166 to the fluid inlet 1308. From there, the DI water is injected past the base plate m ember 1304, through the fluid diffusion member 1302 and into the heat transfer region 1312 between the fluid diffusion member 1302 and the substrate 1250. The presence of warmed fluid behind the substrate 1250, in turn, warms the back side of the substrate 1250. A uniform and elevated substrate temperature facilitates electroless plating operations. A plurality of heating bands 1112 may optionally be embedded in the base plate member 1304, and may be individually controlled, if desired, to more accurately control the DI water temperature flowing into the heat transfer region 1312 and thus the substrate temperature during processing. More particularly, individual control over the heating bands 1112 allows for precise control over the substrate surface, which is important to electroless plating processes.

As an alternative to the heating arrangement described above, the optional heating coils 1112 may be removed from the base plate 1304, and installed into the diffusion plate 1302. To accommodate this redesign, the base plate 1304 may be thinned, while the geometry of the diffusion plate 1302 is increased. As deionized water flows through the fluid inlet 1308, it passes under the heated diffusion plate 1302, through the fluid passages 1306, and then into the heat transfer region 1312 between the backside of the substrate 1250 and the fluid diffusion member 1302. Such an alternate arrangement is shown in FIG. 8B. In this arrangement, the separate fluid heater 1164 may optionally be removed.

The base plate 1304 and diffusion member 1302 may be manufactured from a ceramic material (such as fully pressed Aluminum Nitride, alumina ($Al_2O_3$), silicon carbide (SiC)), a polymer coated metal (such as Teflon™ polymer coated aluminum or stainless steel), a polymer material, or other material suitable for semiconductor fluid processing. Preferred polymer coatings or polymer materials are fluorinated polymers such as Tefzel (ETFE), Halar (ECTFE), PFA, PTFE, FEP, PVDF, etc.

It should be added that the fluid passages 1306 may be configured to direct DI water against the back side of the substrate 1250. The presence of water on the back side of the substrate 1250 not only warms the substrate 1250, but also prevents electroless fluids from undesirably contacting the back side of the substrate 1250.

A plurality of substrate support fingers 1300 are generally positioned proximate the perimeter of the fluid diffusion member 1302. The substrate support fingers 1300 are configured to support the substrate 1250 at a desired distance above the fluid diffusion member 1302 to form the heat transfer region 1312. A robot blade (not shown) may be inserted below the substrate 1250 and between the fingers 1300 to lift and remove the substrate 1250. In an alternate configuration a continuous ring (not shown), instead of the substrate support fingers 1300 may be used to support the substrate. In this configuration a lift pin assembly (not shown) may also be employed to lift the substrate from the continuous ring. In this way, the robot blade may again access the bottom of the substrate 1250 so that it may be transported into and out of the cell 1010. The fluid processing cell 1010 further includes a slot 1108. The slot defines an opening formed through the side wall 1015 to provide access for a robot (not shown) to deliver and retrieve the substrate 1250 to and from the cell 1010.

In the cell 1010 configuration of FIG. 8, the substrate support assembly 1299 can be selectively translated axially and rotated about the base plate support 1301 by use of the upper bearing 1054A and the lower bearing 1054B. To these ends, a substrate support lift assembly 1060 is first provided. The substrate support lift assembly 1060 includes a substrate support assembly motor 1062. In one arrangement, the substrate support assembly motor 1062 is a precision motor that rotates a lead screw 1061. Rotational movement of the motor 1062 converts to linear motion of a finger slide 1064. The finger slide 1064 rides along a grooved housing 1066 to drive the slide up and down. In this instance, the motor 1062 is preferably electrically actuated. Alternatively, the substrate support assembly motor 1062 may be a pneumatically actuated air cylinder.

The substrate support lift assembly 1060 also includes a substrate support finger motor 1052. The finger motor 1052 rotates the substrate support fingers 1300 and supported substrate 1250. The substrate support fingers 1300 rotate about an axis formed by a non-rotating base plate support 1301. The rotational speed of the substrate support member 1299 may be varied according to a particular process being performed (e.g. deposition, rinsing, drying.) In the case of deposition, the substrate support member may be adapted to rotate at relatively slow speeds, such as between about 5 RPMs and about 150 RPMs, depending on the viscosity of the fluid, to spread the fluid across the surface of the substrate 1250 by virtue of the fluid inertia. In the case of rinsing, the substrate support member 1299 may be adapted to spin at relatively medium speeds, such as between about 5 RPMs and about 1000 RPMs. In the case of drying, the substrate support may be adapted to spin at relatively fast speeds, such as between about 500 RPMS and about 3000 RPMs to spin dry the substrate 1250.

The base plate support 1301 is mounted to a chamber base or platform (not shown) by base members 1013 and 1014. Thus, in the preferred embodiment, the base plate member 1304 is not translated by the substrate support lift assembly 1060, but serves as a guide for the substrate support fingers 1300. Upper bearing 1054A and lower bearing 1054B are provided to enable such support. The base plate support 1301 also acts as a conduit for electrical wires (not shown) and the inlet tubing 1308 fed by a substrate fluid inlet line 1166. Wires and tubing are passed through the base plate conduit 1305 in the base member 1014.

Figure 8A:
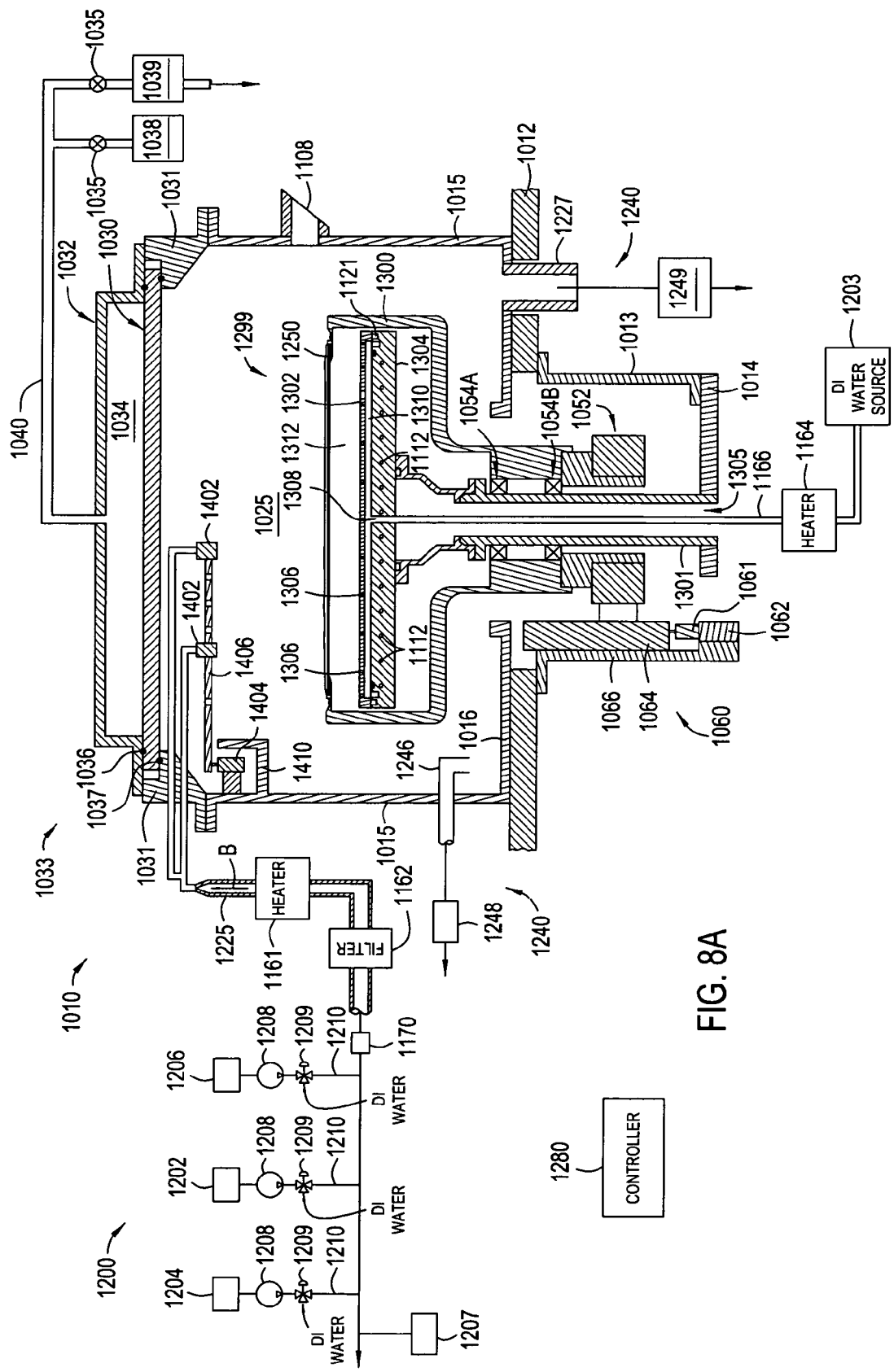
FIG. 8A presents a cross-sectional side view of the face-up, electroless processing chamber of FIG. 8. In this view, the substrate support assembly is in its raised position.
Figure 8B:
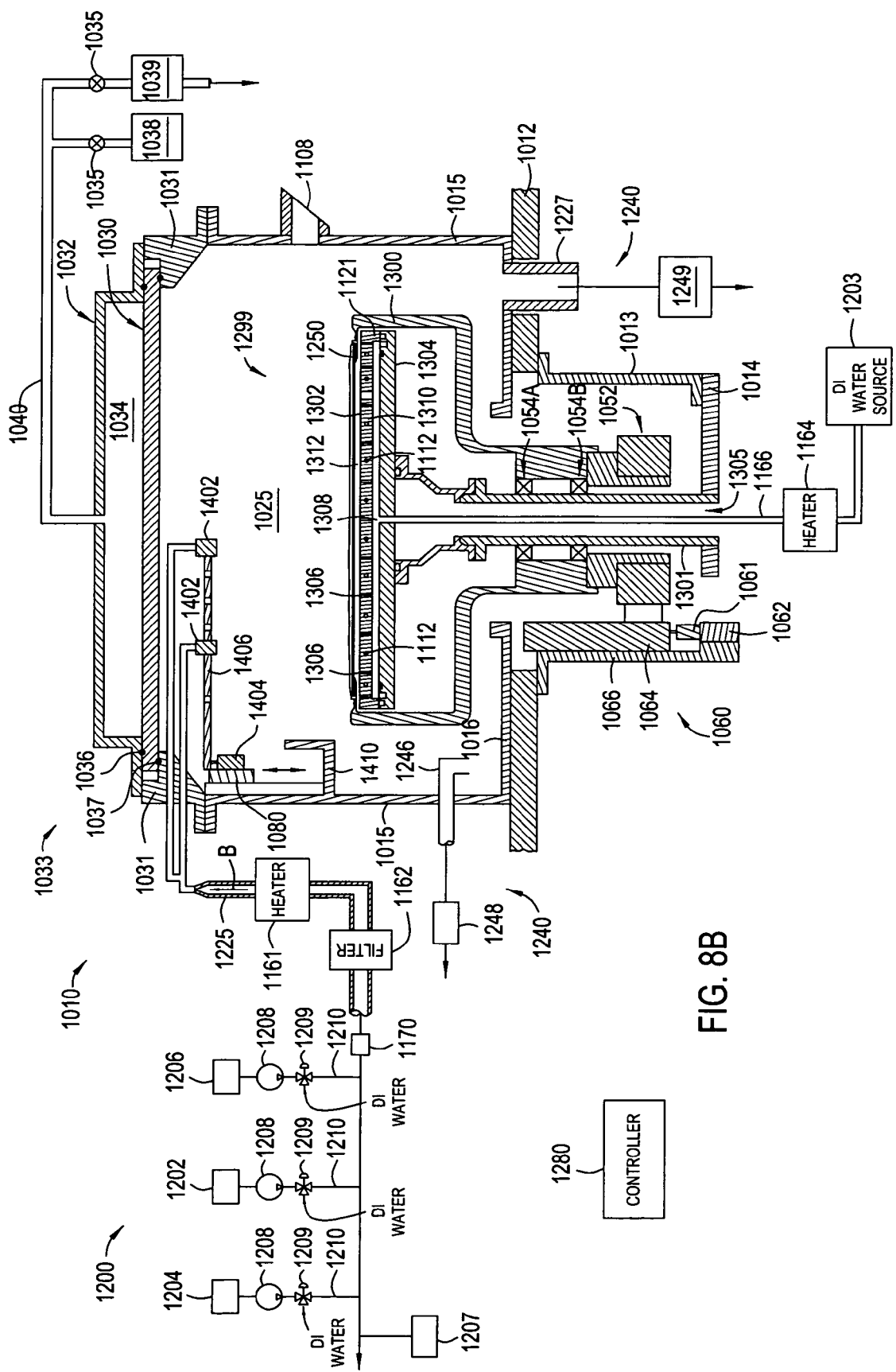
FIG. 8B presents a cross-sectional side view of the face-up, electroless processing chamber of FIG. 8, in an alternate embodiment. Here, the pivot arm is adapted to not only pivot, but to also move axially. In addition, the diffusion plate now includes a heating element.

FIG. 8A presents a cross-sectional side view of the face-up, electroless processing chamber of FIG. 8. In this view, the substrate lift assembly 1060 is in its raised position. The substrate 1250 is lifted away from the surface of the base plate 1304 to allow processing at the ambient temperature of the processing cell 1010, since the substrate is not warmed by the fluid in contact with the fluid volume 1310 and base member 1304. This is also the position the substrate 1250 will typically be placed in prior to the robot coming in to pick-up a processed substrate 1250.

The processing cell 1010 also includes a fluid inlet system 1200. The fluid inlet system 1200 operates to deliver various processing fluids (e.g., solution 1202, solution 1204, and solution 1206, etc.) to the receiving surface of a substrate 1250. The number of processing fluids that can be used in the fluid processing cell 1010 will vary depending on the application, and will likely be more than the three as shown in FIG. 8. A metering pump 1208 is provided in connection with each solution 1202, 1204, 1206. In addition, a dispense valve 1209 is provided for controlling the release of each solution 1202, 1204, 1206 into a respective foreline 1210. Fluids 1202, 1204, 1206 are selectively introduced into the cell 1010 from the forelines 1210 through an inlet tubing 1225. As generally depicted in FIG. 8, the dispense valve 1209 can be configured to rinse the foreline 1210 after chemistry has been delivered from the process fluid sources upstream of the dispense valve 1209.

A filter 1162 is optionally incorporated in the inlet system 1200 to prevent particles generated upstream from the filter 1162 from contaminating the fluid processing cell 1010 and ultimately the substrate 1250. In cases where the inlet line 1225 needs to be rinsed prior to removing the substrate, or in between process steps, the addition of a filter can greatly increase the time it takes to rinse the line due to the large surface area of the filter membranes and thus may not be used.

In another aspect of the invention, a heater 1161 is incorporated into the inlet system 1200 to heat the fluid before it enters the processing area 1025. The heater 1161 contemplated in this invention can be any type of device that imparts energy into the processing fluid. Preferably the heater 1161 is a jacketed type resistive heater (e.g., heater heats the fluid through the wall of the inlet tubing) rather than an immersion type heater (e.g., heater element touches the solution). The heater 1161, used in conjunction with a controller 1280, can be utilized to assure that the temperature of the processing fluid entering the processing area 1025 of the fluid processing cell 1010 is at a desired temperature.

In another aspect of the invention, the heater 1161 is a microwave power source and flow through microwave cavity used to rapidly impart energy into the processing fluid. In on embodiment the microwave power source is run at 2.54 GHz at a power from about 500 W to about a 2000 W. In one embodiment of an inline microwave cavity heater, increases the temperature of the various solutions (e.g., cleaning chemistry, rinse solution, and post clean solution, etc.) up to an optimal level immediately before entering the processing cell. In one embodiment, two separate microwave heaters may be employed to selectively heat separate fluid lines.

In another aspect of the invention, a fluid degassing unit 1170 is incorporated into the inlet system 1200 to remove any trapped or dissolved gas in the processing fluid before it enters the processing area 1025. Since dissolved oxygen tends to inhibit the electroless deposition reactions, oxidize exposed metallic surfaces and affect the etch rate during the electroless cleaning processes the use of the fluid degassing unit can help to reduce any erosion and/or process variability caused by dissolved oxygen present in the in the processing fluids. A fluid degassing unit is generally defined as any unit that can extract dissolved gas from a solution, for example, by use of a gas permeable membrane and a vacuum source. A fluid degassing unit can be purchased, for example, from Mykrolis Corporation of Billerica, Mass.

Each of the respective components found in the fluid processing cell 1010 and other external system components (discussed below) preferably communicates with a process controller 1280, which may be a microprocessor-based control system configured to receive inputs from both a user and/or various sensors positioned on the system, and appropriately control the operation of the chamber and external system in accordance with the inputs. The controller 1280 contains memory (not shown) and a CPU (not shown) which are utilized by the controller to retain various programs, process the programs, and execute the programs when necessary. The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include cache, power supplies, clock circuits, input/output circuitry, subsystems, and the like all well known in the art. A program (or computer instructions) readable by the controller 1280 determines which tasks are performable in the processing chamber. Preferably, the program is software readable by the controller 1280 and includes instructions to monitor and control the electroless process based on defined rules and input data.

In the cell embodiment of FIG. 8, 8A and 8B, the fluid inlet system 1200 operates through a spraying mechanism. More specifically, processing fluids, e.g., fluids 1202, 1204, 1206, are selectively delivered to the receiving surface of the substrate 1250 via a fluid delivery arm 1406. A plurality of nozzles 1402 is formed along the fluid delivery arm 1406. The nozzles 1402 receive fluid from the inlet tubing 1225, and direct the processing fluids at the receiving surface of the substrate 1250. The nozzles 1402 may be disposed either at an end of the delivery arm 1406, or along a length of the arm 1406. In the arrangement of FIGS. 8, 8A and 8B, a pair of nozzles 1402 are placed in an equidistantly spaced apart arrangement.

In the configuration of FIG. 8, the arm 1406 has a length that enables a distal end to extend over the center of the substrate 1250. It is preferred that at least one of the nozzles 1402 be positioned at the distal end of the fluid delivery arm 1406. It is also preferred that the fluid delivery arm 1406 be moveable about a dispense arm motor 1404, which is adapted to cause the arm 1406 to pivot to and from the center of the substrate 1250. In FIGS. 8, 8A and 8B, the fluid delivery arm 1406 pivots in response to movement of the arm motor 1404. The arm motor 1404 is preferably disposed behind a guard member 1410 to partially isolate the arm motor 1404 from the chamber processing area 1025.

In one embodiment, the fluid delivery arm 1406 is adapted to not only pivot, but to move axially as well. FIG. 8B presents a cross-sectional side view of the face-up, electroless processing chamber of FIG. 8, in an alternate embodiment. Here, the pivot arm 1404 is connected to an axial motor 1080 (e.g., a linear motor). Movement of the arm 1406 in an axial direction allows the arm 1406 to be selectively moved closer to the substrate 1250, if desired.

Figure 9:
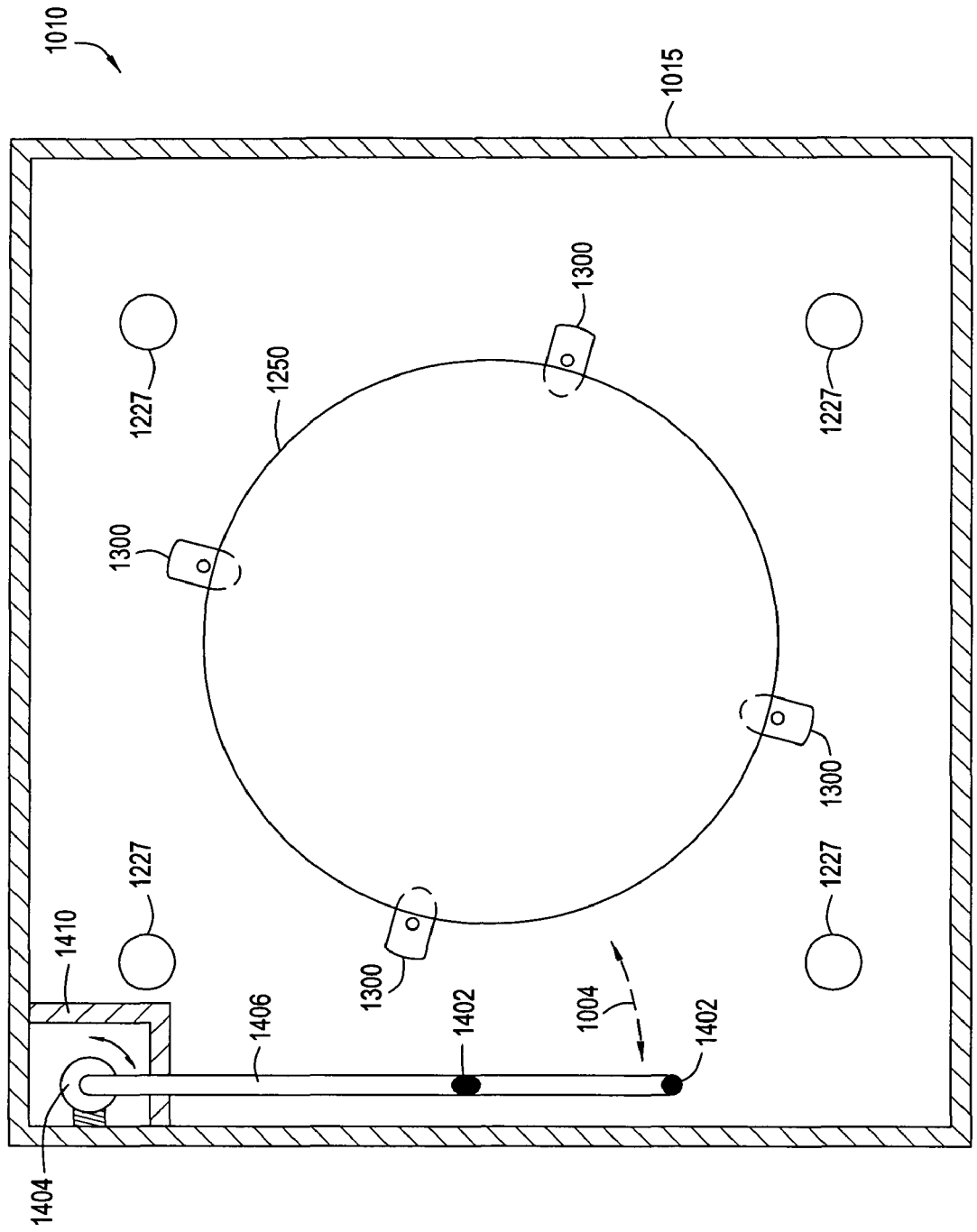
FIG. 9 shows a top view of the face-up, electroless processing chamber of FIG. 8. Here, the fluid delivery arm of the fluid intake system is seen relative to a mounted substrate.

FIG. 9 illustrates a top view of the face-up, electroless processing chamber of FIG. 8. Here, the fluid delivery arm 1406 of the fluid inlet system 1200 is seen relative to a mounted substrate 1250. Four illustrative support fingers 1300 are shown supporting the substrate 1250. The arm 1406 is rotated away from the substrate 1250 in this view. This position allows the substrate 1250 to be lifted using lift pins or a substrate lift assembly, such as assembly 1060 described above. However, arrow 1004 indicates a rotational movement path for the arm 1406, demonstrating that the arm 1406 may rotate the nozzles 1402 over the substrate 1250 during processing. Movement of the delivery arm 1406 over the substrate 1250 improves fluid coverage of the substrate 1250. Preferably, the substrate support member rotates during dispensation of a fluid from the nozzle 1402 in order to increase fluid distribution uniformity and throughput of the system.

In another embodiment, processing fluids are delivered through one or more nozzles disposed proximate the axis of rotation for the substrate. At the same time, a carrier gas (such as $N_2$ or Ar) is delivered through nozzles disposed along an outer edge of the substrate. During a fluid delivery operation, the substrate is preferably rotated. The injection of the carrier gas around the edge of the substrate 1250 forms a gas blanket around the processing area 1025. The gas blanket displaces any residual $O_2$ that may linger within the processing region. Those of ordinary skill in the art of electroless deposition processing will appreciate that oxygen can have a detrimental affect on certain process steps, such as the chemical activation step.

Figure 12:
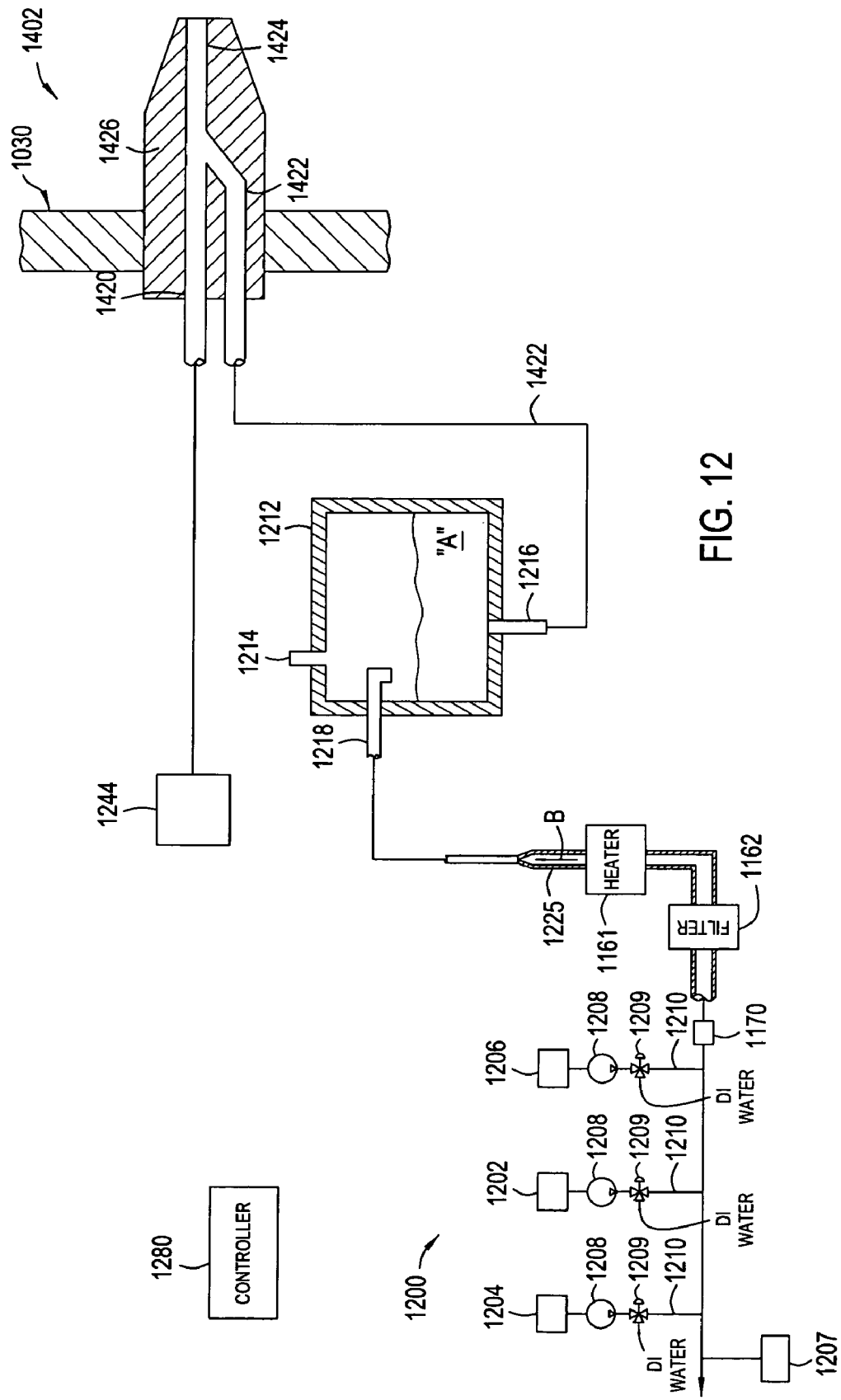
FIGS. 12 and 13 present cross-sectional views of nozzles as may be employed in connection with the electroless processing chambers described herein.

In one embodiment, the nozzles 1402 are ultrasonic spray nozzles, or "air atomizing nozzles." FIG. 12 shows a cross-sectional view of an air atomizing nozzle 1402 in one design. This is an internal fluid mix type nozzle. This means that fluids are mixed internally to produce a completely atomized spray, or mist of the processing fluid. In this configuration the carrier gas, e.g., Argon, contains small droplets of processing solution. In one embodiment an inert gas may be used to transport an atomized activation solution to the substrate surface. Alternatively, an inert gas may be used to transport an atomized electroless deposition solution to the substrate 1250.

In the nozzle design 1402 of FIG. 12, the nozzle 1402 includes a body 1426 and a tip 1424. The tip 1424 is generally about 10 μm to about 200 μm in diameter. In one embodiment, the tip 1424 is about 10 μm to about 50 μm in diameter. Fluids are delivered through the tip 1424 due to suction created by a venturi effect created when high pressure gas delivered from the nozzle gas supply 1244. In the arrangement of FIG. 12, the body 1426 provides separate channels 1422, 1420 for receiving separate liquid and gas streams, respectively. The liquid 1422 and gas 1420 channels merge at the tip 1424, allowing the two streams to blend. This may be referred to as a "concentric venturi design." In this arrangement, fluid distributed from the nozzle 1402 is pre-mixed to produce a completely atomized spray. The particular tip design 1424 of FIG. 12 produces a round spray pattern. However, it is understood that other tip configurations may be used to produce other spray patterns, such a flat or fan spray pattern.

Figure 13:
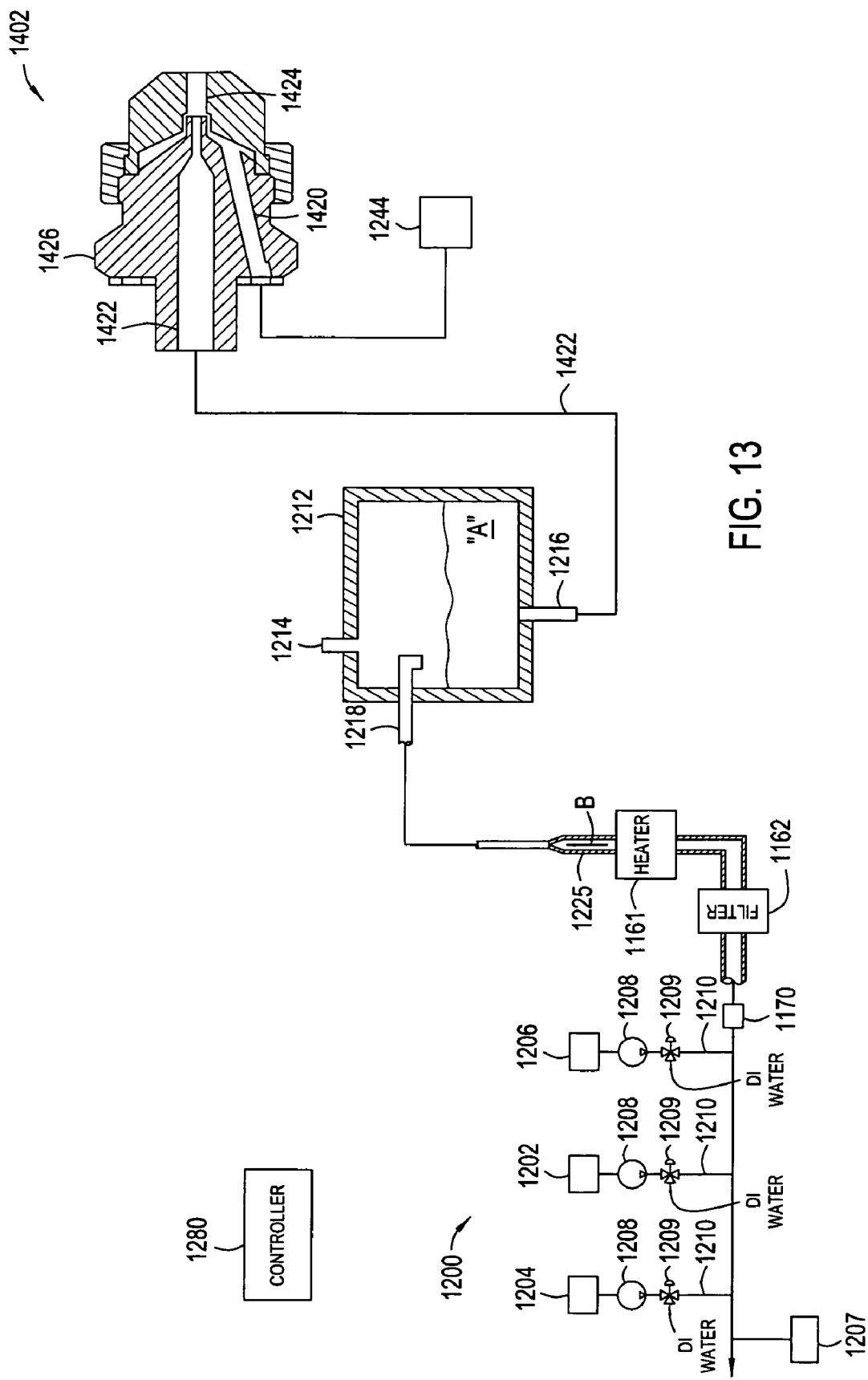

FIG. 13 provides a cross-sectional view of an air atomizing nozzle 1402 in a different design. This is an external fluid mix nozzle. In the nozzle design 1402 of FIG. 13, the nozzle 1402 again includes a body 1426 and a tip 1424. The tip 1424 is again generally about 10 μm to about 200 μm in diameter or, in another embodiment, about 10 μm to about 50 μm in diameter. In the arrangement of FIG. 13, the body 1426 again provides separate channels 1422, 1420 for receiving separate liquid and gas streams, respectively. However, in this arrangement the liquid channel 1422 delivers liquid through the nozzle 1402 independently of the gas channel 1420 so that the two streams do not blend within the body 1426, but mix outside of the nozzle 1424. This may be referred to as a "parallel venturi design." This arrangement has the benefit that gas and liquid flow can be controlled independently, which is effective for higher viscosity liquids and abrasive suspensions. This is in contrast to the internal mix type nozzle 1402, where a change in gas flow will affect the liquid flow.

The use of an ultrasonic nozzle such as the nozzles of FIGS. 12 and 13 produces an atomized mist directed at the receiving surface of a substrate. Direction of mist, as opposed to a liquid stream, serves to conserve the expensive electroless processing fluids. It also provides a more uniform coverage across the receiving surface. Also, a fluid dynamic boundary layer, which is created when the substrate 1250 is rotated by use of the substrate support finger motor 1052, can improve the distribution of the atomized processing fluid on the surface of the substrate 1250, since the shape of the boundary layer at the surface of a rotating disk is generally flat or parallel to the surface of the substrate in any direction. The boundary layer effect seen by the atomized processing fluid can be an advantage over conventional spray designs, which cause a stream of fluid to impinge the surface of the substrate, since any non-uniform spray patterns created by one or more nozzles may be minimized by the boundary layer's control over the transport of the atomized fluid to the surface of the substrate.

A fluid supply is provided for fluids delivered to the nozzles 1402. In FIGS. 12 and 13, a tank 1212 is shown. The tank 1212 includes a fluid inlet 218, and a vent 1214. The vent 1214 is in fluid communication with atmospheric pressure. In addition, a fluid outlet 1216 is provided. During fluid delivery, gases from source 1244 are delivered to the nozzle 1402 at high velocities. This creates a relative negative pressure in fluid line 1422 due to communication with atmospheric pressure through vent 1214. Fluids are then urged through the outlet 1216 and into the nozzle 1402.

In one embodiment, the processing fluid is an activation solution. Examples of activation solutions include palladium salts include chlorides, bromides, fluorides, fluoborates, iodides, nitrates, sulfates, carbonyls, salts of metal acids, and combinations thereof. In one embodiment the palladium salts are chlorides, such as palladium chloride ($PdCl_2$). In another embodiment the palladium salt is a nitrate, alkanesulfonate, or another soluble derivative of $Pd^{+2}$ containing a non-coordinating anion not prone to cluster formation in either the solution or on the metal surface. In one embodiment the queue time (or wait time) between the end when the copper clean solution is applied and the start time of when the activation solution is applied is generally less than about 15 seconds, and preferably less than about 5 seconds. The activation solution generally operates to deposit an activated metal seed layer on to the exposed copper of the exposed features. Oxidation of the exposed portion of the copper layer after cleaning thereof may be detrimental to subsequent process steps, since copper oxides are known to have a higher electrical resistivity than copper. The short queue time between copper clean and activation minimizes oxidation, while the use of a carrier gas environment around the fluid processing cell may also help to prevent oxidation of the exposed portion of the copper layer, as described above.

In one embodiment the processing fluid is an electroless deposition solution. In one embodiment, an electrolessly deposited capping layer is deposited which is an alloy containing CoP, CoWP, CoB, CoWB, CoWPB, NiB, or NiWB, and preferably includes CoWP or CoWPB. The electroless deposition solution used to form the capping layer may include one or more metal salts and one or more reducing agents, depending of the capping layer material to be deposited. The electroless deposition solution may also include pH adjusters, such as acids or bases, as is generally known in the art. When the selected capping layer contains cobalt, the electroless deposition solution generally includes a cobalt salt. Examples of cobalt salts include chlorides, bromides, fluorides, acetates, fluoborates, iodides, nitrates, sulfates, salts of other strong or weak acids, and/or combinations thereof. Preferably, the cobalt salt includes cobalt sulfate, cobalt chloride or combinations thereof. If a tungsten-containing capping material is to be deposited, the electroless deposition solution includes a tungstate salt. Preferably, the tungstate salt includes a salt of tungstic acid, such as ammonium tungstate or tetramethyl ammonium tungstate, or may be generated through the neutralization of the tungstic acid. If a nickel-containing capping material is to be deposited, the electroless solution generally includes a nickels salt. Examples of nickel salts include chlorides, bromides, fluorides, acetates, fluoborates, iodides, nitrates, sulfates, carbonyls, salts of strong or weak acids, and/or combinations thereof.

When the selected capping layer material includes phosphorus, such as. CoP, CoWP, or CoWPB, the reducing agent preferably includes a phosphorus compound, such as the hypophosphite anion ($H_2PO_2$). If the capping material includes boron, such as CoB, CoWB, CoWPB, the reducing agent generally includes a boron compound, a dimethylamine-borane (DMAB), a non-alkali metal salt of a borohydride ($BH_4^-$) anion, or combinations thereof. Other reducing agents may also be used in addition to or alternatively with the reducing agents above, such as hydrazine. In one embodiment a borane co-reducing agent is used for processes that are initiated on copper.

As noted, the electroless deposition solution (processing fluid) and/or the substrate may be heated to a temperature. Exemplary temperatures are between about 40° C. and about 95° C. In one aspect, heating the electroless deposition solution and/or the substrate structure increases the electroless deposition rate. This helps offset temperature drop experienced by the processing fluid when it exits the nozzles 1402. In one embodiment, the deposition rate of the capping material is about 100 Å/min or more. In one embodiment, the capping material is deposited to a thickness between about 100 Å and 300 Å, preferably about 150 Å to about 200 Å. However, it is desirable to maintain the temperature across the substrate at a uniform temperature, as the deposition rate of an electroless process is known to be dependent upon temperature. As such, heating coils 1112 of base plate member 1304 illustrated in FIG. 8 and/or the heater 1164 may be used.

The processing cell 1010 also includes a fluid outlet system 1240. The fluid outlet system 1240 generally contains an outlet line 1227 that is connected to a fluid drain 1249. Optionally, more than one outlet line 1227 may be disposed about the cell 1010 in order to more evenly draw fluids through the cell 1010. In FIG. 9, it can be seen that four generally equidistantly spaced outlets 1227 are provided. The multiple outlets 1227 may be tied to a single exhaust plenum and fluid drain 1249. The fluid drain 1249, in turn, delivers the chamber effluent to a waste collection drain (not shown). In summary, the processing fluids will generally flow through the inlet tubing 1225 then through the fluid delivery arm 1406, through the nozzles 1402, and then outward through the processing area 1025 towards the substrate support fingers 1300 and then out the one or more fluid drains 1227. Chemicals will contact and treat the receiving surface of the substrate 1250 in the processing area 1025.

The fluid outlet system 1240 includes a gas exhaust. An exhaust tube 1246 extends through the wall 1015. An exhaust system 1248 pulls gases out of the processing area 1025. In one embodiment, the exhaust inlet 1246 is a ring/plenum which draws in gas evenly below the surface of the substrate 1250 to improve the gas flow near the surface of the substrate 1250.

Figure 10:
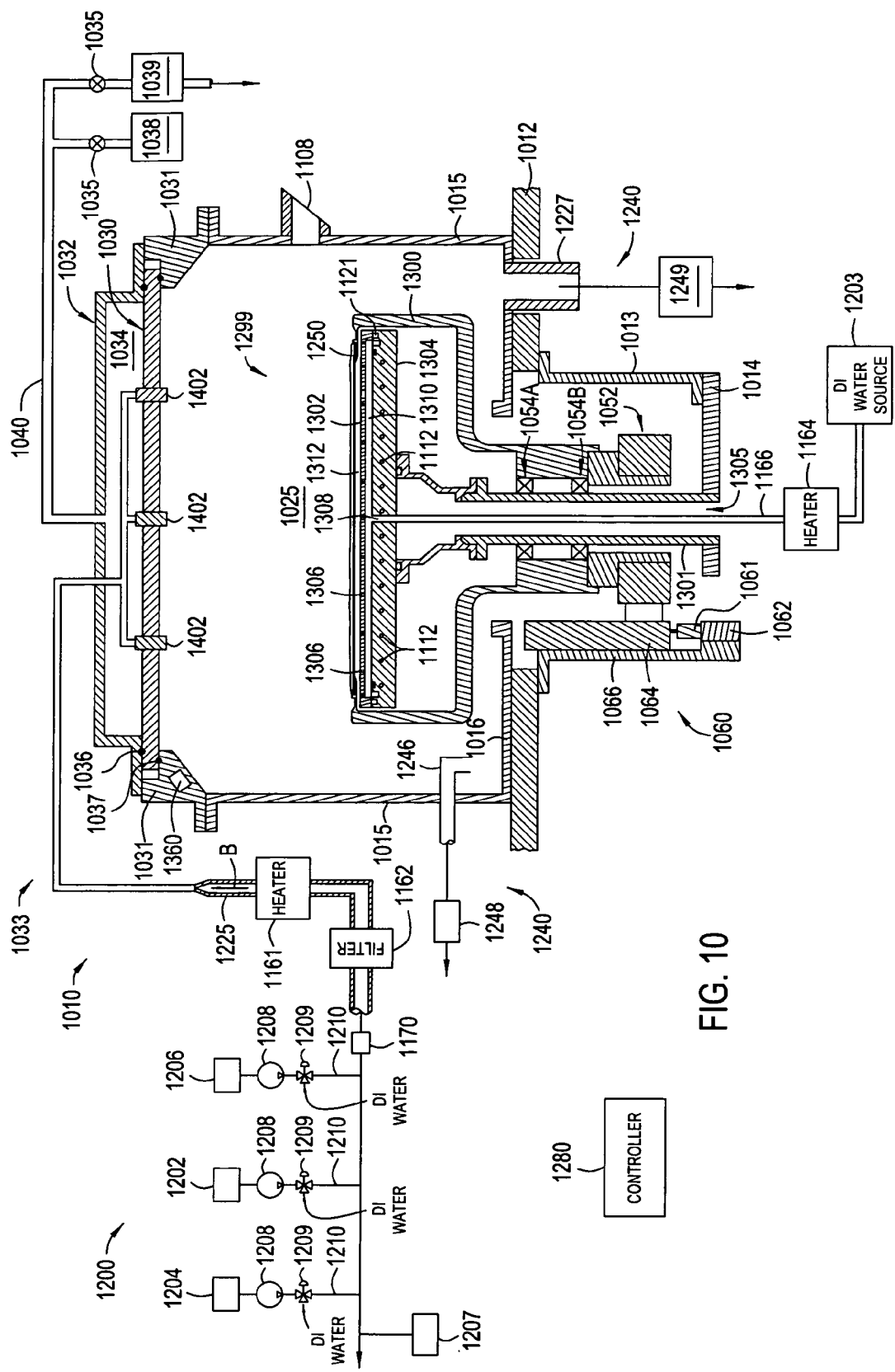
FIG. 10 provides a cross-sectional side view of a face-up, electroless processing chamber, in an alternate embodiment. Here, processing fluids are delivered through one or more nozzles disposed in a gas delivery plate within a chamber lid assembly.

FIG. 10 provides a cross-sectional side view of a face-up, electroless processing cell 1010, in an alternate embodiment. A fluid intake system 1200 is again provided for delivering fluids to the receiving surface of a substrate 1250. Processing fluids are again delivered through one or more nozzles 1402. However, in this embodiment, the nozzles 1402 are disposed in a gas delivery porous plate 1030 within the chamber lid assembly 1033.

The chamber lid assembly 1033 first includes a gas delivery porous plate 1030. Preferably, the gas delivery porous plate 1030 is a porous plate, permitting air to move there through. Exemplary materials for the porous plate include ceramic materials (e.g., alumina), polyethylene (PE), and Polypropylene, PVDF, with pores formed or holes fabricated therein to permit fluid communication. In one embodiment a HEPA filter ("High Efficiency Particulate Air" filter) arrangement may be employed. HEPA filters utilize glass fiber rolled into a paper-like material. The gas delivery porous plate 1030 in FIG. 10 is supported by an upper support ring 1031.

The chamber lid assembly 1033 next generally includes a lid 1032. The lid forms a plenum 1034 in the volume between the lid assembly 1033 and the gas delivery porous plate 1030. The lid 1032 is supported in the arrangement of FIG. 10 by both the gas delivery porous plate 1030 and the upper support ring 1031. The fluid inlet tubing 1225 extends through the lid 1032, and then manifolds to the one or more nozzles 1402 in the porous plate 1030.

The fluid processing cell 1010 of FIG. 10 shows a gas line 1040. The gas line 1040 provides a flow path from a gas supply 1038 and into the chamber lid plenum 1034. Valves 1035 selectively open and close fluid communication with line 1040. In one aspect, the gas supply 1038 provides oxygen within the processing region 1299. Oxygen is not objectionable in some processes. For example, oxygen may be added during the activation step. Preferably, a carrier gas is combined with hydrogen and oxygen in a desired combination, and delivered into the plenum 1034. In one embodiment, the gas supply 1038 supplies an inert gas, such as, argon, nitrogen, helium, or combination thereof.

The plenum 1034 and gas delivery porous plate 1030 are positioned above the wafer 1250 to allow a carrier gas to be delivered over the wafer 1250 via laminar flow. The laminar gas flow creates a uniform and perpendicular gas flow onto the wafer 1250. In this way, a uniform boundary layer is provided along the radius of the wafer 1250. This, in turn, allows for a more uniform heat loss across the wafer radius, and serves to reduce condensation of water and chemical vapors above and on the wafer.

In one embodiment, a heating element (not shown) is placed in the lid assembly 1033 proximate the plenum 1034. For example, heating coils (not shown) may be disposed within the delivery porous plate 1030. This provides for heating of the gases delivered from line 1040, which in turn minimizes condensation and droplets formation above the wafer 1250.

From line 1040, gas flows into the plenum 1034, and then penetrates through the porous plate 1030. The porous plate 1030 acts as a gas flow diffuser. Gas then flows down across the substrate 1250 receiving surface for processing. The gas flowing through the porous plate 1030 can thus help direct and evenly distribute the processing fluid mist flowing from the nozzles 1402 onto the receiving surface of the substrate 1250. Finally, gas is exhausted through an exhaust inlet 1246 by exhaust system 1248. The exhaust system 1248 may generally contain an exhaust fan or vacuum, pump to draw gas from the fluid processing cell 1010. It is noted that the exhaust inlet 1246 helps to assure that the gas flow past the substrate 1250 is laminar.

In one embodiment, the gas line 1040 is connected to the inlet system 1200 to allow a fluid (e.g., processing fluids), instead of gas, to be pushed through the porous plate 1030. In this way, the porous plate 1030 would act like a showerhead to deliver processing fluid to the surface of the substrate 1250.

The gas line 1040 may serve not only as a fluid delivery line, but also as a vacuum line. A vacuum source 1039 is provided, and is used to prevent dripping of any fluid attached to the porous plate 1030 just before transferring the substrate 1250 out of the cell 1010. In this respect, the vacuum source 1039, such as a vacuum venturi, is actuated to create a vacuum in the chamber lid plenum 1034. This, in turn, causes any fluid on the lower surface of the porous plate 1030 to be "sucked up" into the plenum 1034.

Figure 10A:
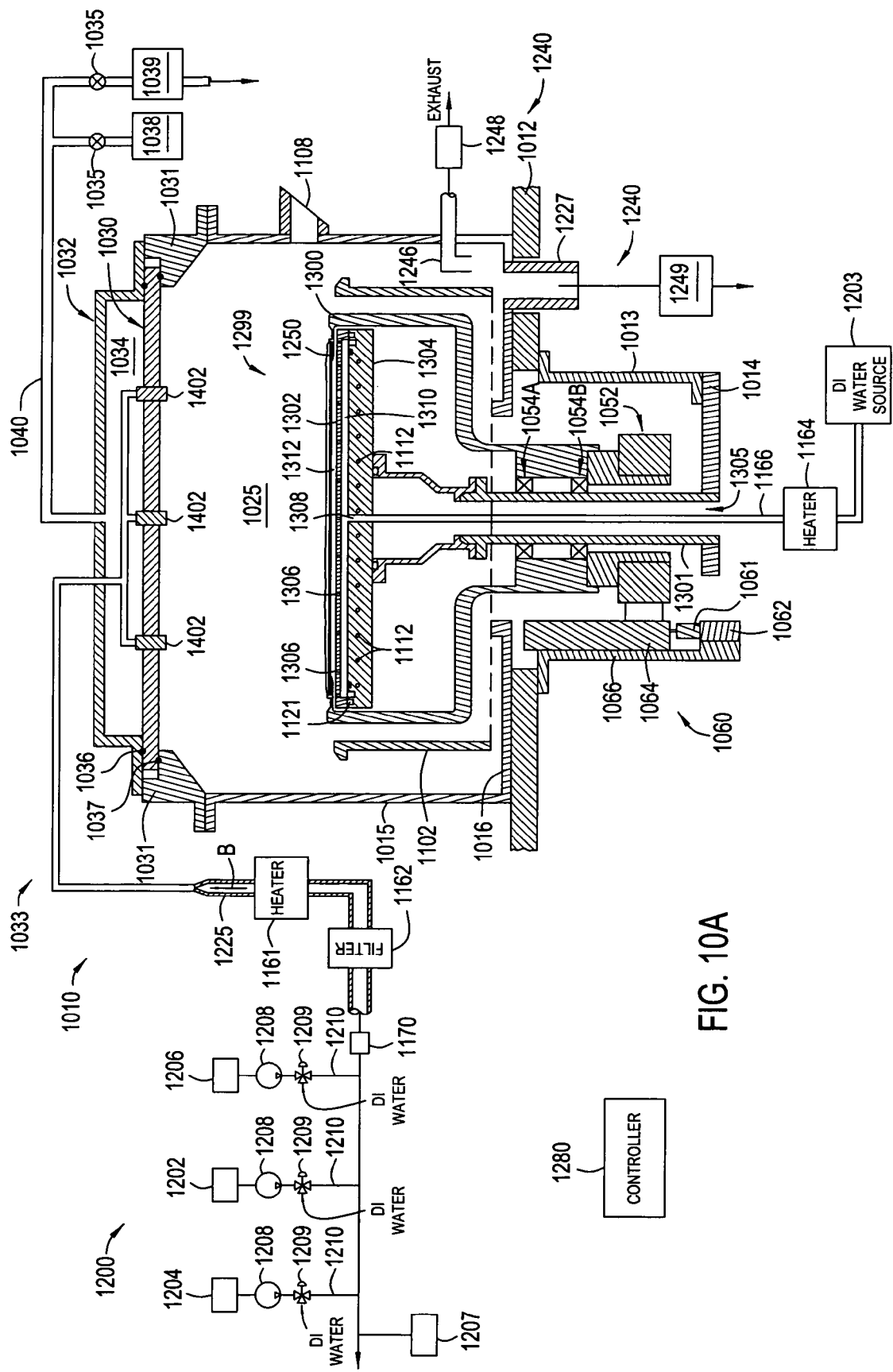
FIG. 10A presents a cross-sectional side view of the face-up, electroless processing chamber of FIG. 10. In this view, a gas flow diverter is provided within the chamber. In this view, the gas flow diverter is in its lowered position.

FIG. 10A presents a cross-sectional side view of the face-up, electroless processing chamber of FIG. 10. In this view, a gas flow diverter 1102 is provided within the cell 1010. The gas flow diverter 1102 is selectively raised and lowered by use of an external gas flow diverter lift mechanism (not shown). In this view, the gas flow diverter 1102 is in its lowered position. FIG. 10A illustrates the gas flow diverter's 1102 position when the substrate 1250 is being transferred in and out of the fluid processing cell 1010.

Figure 10B:
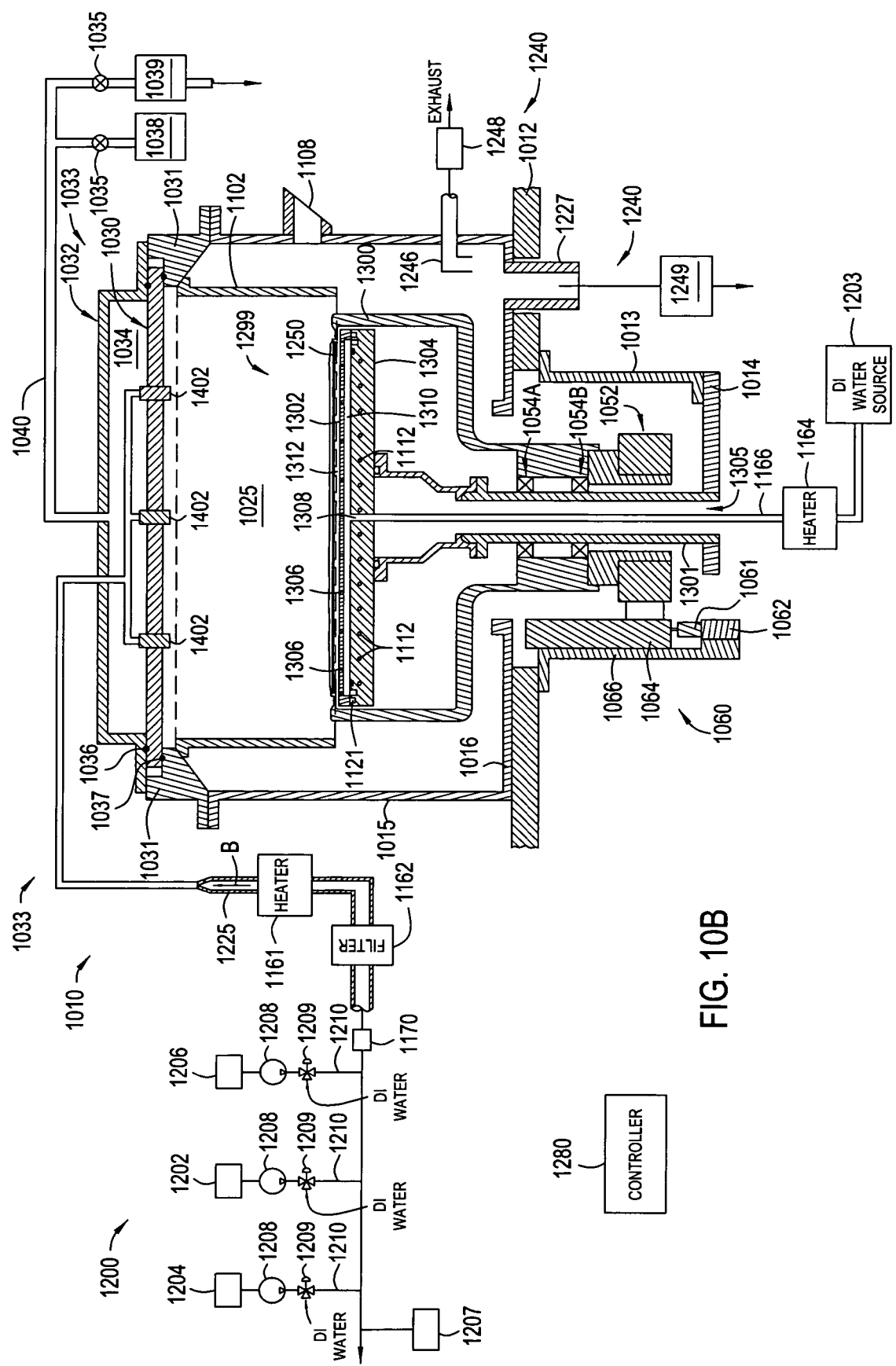
FIG. 10B shows another cross-sectional view of the face-up, electroless processing chamber of FIG. 10. Here, the gas flow diverter is in its raised position.

FIG. 10B shows another cross-sectional view of the face-up, electroless processing chamber of FIG. 10. Here, the gas flow diverter is in its raised position. In this position, the gas flow diverter 1102 is used to "straighten" the flow of mist as it passes from the nozzles 1402 and towards substrate 1250 during processing.

It is desirable to provide a means to visually inspect the progress of fluid being dispensed on the substrate 1250 external to the cell 1010. In the arrangement of FIG. 10, a camera 1360 is provided inside the cell 1010. The camera may be disposed along the wall 1015, under the gas delivery porous plate 1030, along the upper support ring 1031, or any other place where adequate visualization of the substrate 1250 may be acquired. Preferably, the camera 1360 is placed on a stationary portion of the lid. In the embodiment of FIG. 10, the camera 1360 is affixed to the upper support ring 1031.

To aid the camera 1360, it is desirable to provide a light source (not shown). The light source would also preferably be placed on a stationary portion of the lid; however, it may be positioned at any position adjacent the processing area 1025. The light source serves to illuminate the substrate 1250 during processing.

The camera 1360 is preferably a charge coupled display camera ("CCD camera") that employs a series of pixels to record a digital image. A monitor (not shown) is set up external to the cell 1010 to provide optical visualization of the surface of the substrate 1250. In this way, visual confirmation may be provided as to the dispensing of fluids, and adequate coverage by electroless processing fluids of the substrate 1250.

The visual confirmation is preferably provided through human monitoring. However, in one arrangement the visual confirmation process is provided through a machine vision control type process. In this arrangement, the image of an adequately covered substrate 1250 is programmed into a controller (e.g., a computer). The controller then monitors the pixel images generated by the camera 1360 during a fluid dispensing process. The fluid dispensing process is not allowed to time out at least until the actual substrate image detected by the pixels in the camera 1360 matches the pre-recorded image.

The camera 1360 may optionally be an infrared camera. The infrared camera would filter out visual wavelengths, but recognize thermal wavelengths. A difference in color is within an image is thus an indication of temperature differentials in the subject, i.e., the substrate 1250. Where the fluid being dispensed is at a temperature different than the surface of the substrate 1250, a temperature differential will be recorded as a color differential. Fluid dispensing would continue until the temperature differential disappears, providing an indication of complete coverage of the substrate 1250. Preferably, the temperature differential would again be monitored through machine visual control. Therefore, complete coverage of the substrate can be assured.

In one arrangement, the camera 1360 may operate under the control of a closed loop with software optimization of the motion of the chemical dispense arm 1406 and flow regime from the chemical nozzles 1402 to ensure that the surface of the wafer 1250 has continuous chemical coverage.

Figure 11:
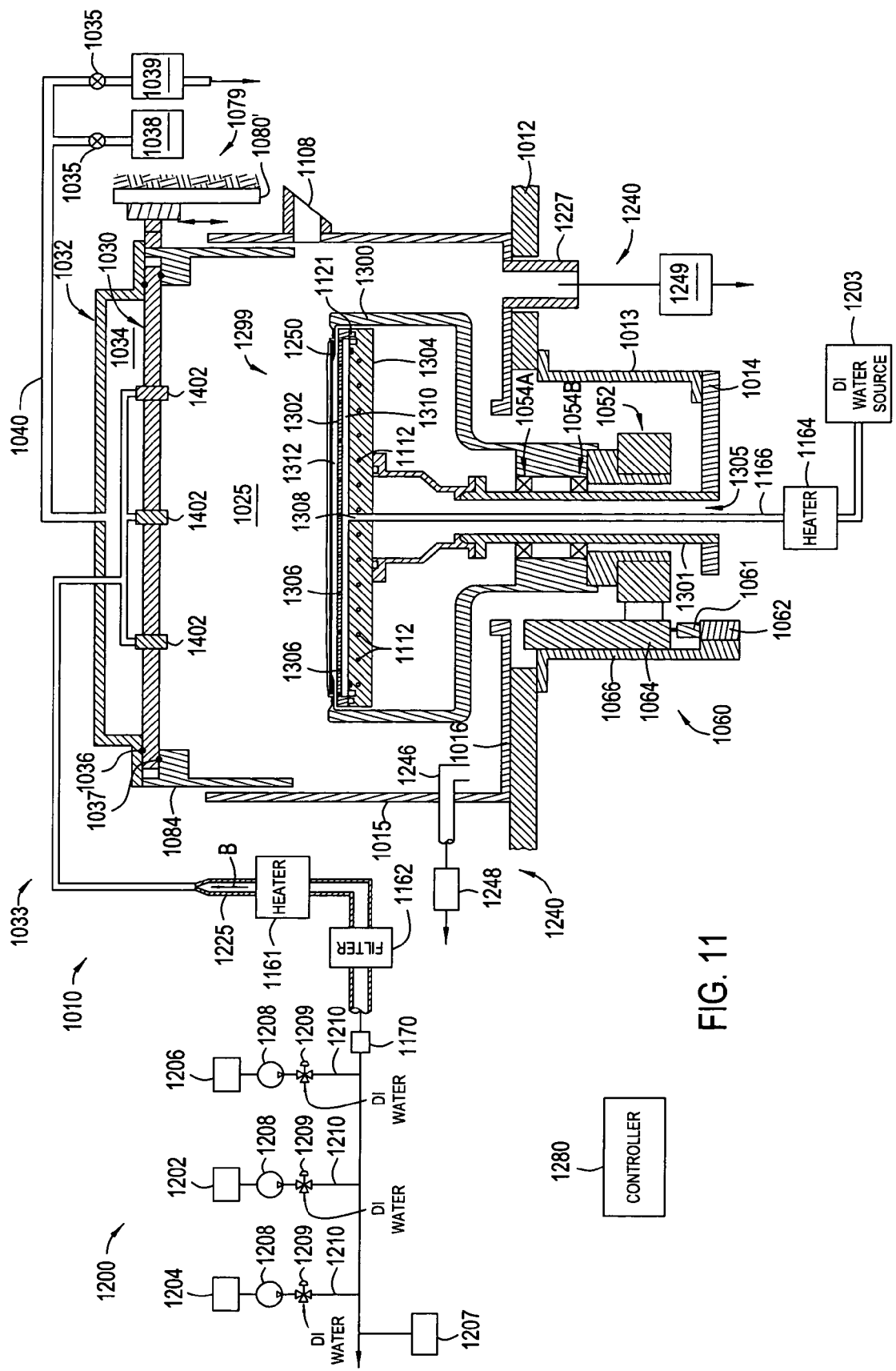
FIG. 11 presents a cross-sectional view of a face-down, electroless processing chamber, in yet an additional alternate embodiment. Here, processing fluids are again applied to a receiving surface of a substrate by spraying fluids through nozzles disposed in a gas delivery plate. In this embodiment, the chamber lid assembly moves axially relative to the substrate.

FIG. 11 presents a cross-sectional view of a face-up, electroless processing cell 1010, in yet an additional alternate embodiment. Here, processing fluids are again applied to a receiving surface of a substrate 1250 by spraying fluids through nozzles 1402 disposed in a gas delivery porous plate 1030. In this embodiment, the gas delivery porous plate 1030 is selectively raised and lowered relative to the substrate 1250. More specifically, the chamber lid assembly 1033 moves axially relative to the substrate 1250. To accomplish this axial movement, a chamber lid lift assembly 1079 is employed. A chamber lid motor (schematically represented by item 1080') may be used as part of the chamber lid lift assembly 1079. The motor 1080' is preferably electrically actuate, and in one embodiment, a linear motor may be used. However, it may alternatively represent a pneumatically actuated air cylinder.

By actuating the motor 1080', the chamber lid lift assembly 1079 controls the volume of the processing area 1025 between the porous plate 1030 and the substrate 1250 there below. Such an arrangement is useful to control the gas flow and oxygen level near the surface of the substrate 1250.

The various embodiments for a face up electroless plating cell described above have been described in the context of processing a substrate 1250. However, it is noted that the plating cell may be operated without a substrate on the support fingers 1300 (or support ring). More specifically, the fluid delivery system 1200 and the fluid outlet system 1240 may be operated without placement of the substrate within the processing region 1299. For example, deionized water or other cleaning or rinsing fluid may be injected through a fluid delivery arm (such as arm 1406 of FIG. 8) or a fluid delivery plate (such as gas delivery porous plate 1030 of FIG. 10) without the substrate. This would be done to provide cleaning to the support fingers 1300 and other chamber parts. To further aid in this cleaning step, the fluid delivery arm may be lowered (per FIG. 8B), the fluid delivery head may be lowered (per FIG. 11) or the substrate support assembly may be raised (per FIG. 8A).

While the foregoing is directed to embodiments of the present invention, other and further embodiments of the invention may be devised without departing from the basic scope thereof, and the scope thereof is determined by the claims that follow.

The invention claimed is:

1. A processing chamber having a processing region adapted to process a substrate, comprising:
a platen assembly positioned in the processing region, the platen assembly comprising:
a base member having a fluid aperture formed therethrough;
a fluid diffusion member sealably positioned on the base member and having an upstream side and a downstream side, wherein the fluid diffusion member has a plurality of fluid passages in fluid communication between the upstream side and the downstream side; and
a fluid volume formed between the base member and the upstream side of the fluid diffusion member; and
a rotatable substrate support assembly positioned in a processing region and having a substrate supporting surface, wherein the rotatable substrate support is adapted to rotate relative to the platen assembly.

2. The processing chamber of claim 1, further comprising:
a fluid source that is adapted to deliver an electroless processing solution to a surface of a substrate positioned on the substrate support; and
a fluid heater in thermal communication with the electroless processing solution delivered from the fluid source.

3. The processing chamber of claim 2, further comprising a fluid degassing unit that is in fluid communication with the fluid source.

4. The processing chamber of claim 2, wherein the fluid heater is a microwave heater that is adapted to heat the processing fluid delivered from the fluid source.

5. The processing chamber of claim 2, wherein the processing chamber further comprises one or more nozzles in fluid communication with the fluid source and the surface of the substrate positioned on the rotatable substrate support.

6. The processing chamber of claim 5, further comprising an arm assembly that is positioned above the fluid diffusion member and is adapted to position the one or more nozzles in a desired position above a surface of a substrate positioned on the rotatable substrate support.

7. The processing chamber of claim 1, wherein the rotatable substrate support assembly comprises a plurality of substrate engaging fingers.

8. The processing chamber of claim 1, further comprising:
a lift assembly in communication with the rotatable substrate support assembly, wherein the lift assembly is adapted to position the substrate supporting surface of the rotatable substrate support assembly relative to the fluid diffusion member.

9. The processing chamber of claim 1, further comprising:
a temperature controlled fluid source that is in fluid communication with the fluid aperture, the fluid volume and a substrate that is positioned on the substrate receiving surface.

10. The processing chamber of claim 1, wherein the plurality of fluid passages are pores formed in a porous ceramic material or a porous plastic material.

11. The processing chamber of claim 10, wherein the pore size in the porous ceramic material or the porous plastic material is between about 0.1 micrometers to about 500 micrometers.

12. The processing chamber of claim 1, further comprising a baffle positioned in the fluid volume, wherein the baffle is adapted to restrict the communication of a fluid delivered from the fluid aperture to the plurality of fluid passages.

13. The processing chamber of claim 1, wherein the platen assembly further comprises a heating element in thermal communication with a fluid positioned in the fluid volume.

14. The processing chamber of claim 13, wherein the heater is a resistive heating element embedded in the base member.

15. The processing chamber of claim 1, wherein the platen assembly further comprises a fluid heating element that is in fluid communication with the fluid volume.

16. The processing chamber of claim 1, wherein the processing chamber further comprises:
  one or more walls enclosing the processing region of the processing chamber;
  a bowl member positioned below the substrate receiving surface and further comprising:
    an interleaving wall connected to a wall that encloses the processing region of the processing chamber;
    a bowl mounted in the processing region that comprises:
      a base wall; and
      a first wall and a second wall that protrude above the base wall; wherein the first wall and the second wall are substantially parallel to the interleaving wall and the interleaving wall is positioned between the first wall and the second wall; and
    a fluid disposed in the region between the first wall and the second wall and is in contact with the interleaving wall.

17. The processing chamber of claim 1, further comprising:
  one or more walls enclosing the processing region of the processing chamber; and
  a gas source adapted to deliver a processing gas to the processing region.

18. A processing chamber adapted to process a substrate, comprising:
  one or more walls forming an enclosed processing region of the processing chamber;
  a platen assembly positioned in the enclosed processing region, the platen assembly comprising:
    a base member having a fluid aperture formed therethrough;
    a fluid diffusion member sealably positioned on the base member and having an upstream side and a downstream side, wherein the fluid diffusion member has a plurality of fluid passages in fluid communication between the upstream side and the downstream side; and
    a fluid volume formed between the base member and the upstream side of the fluid diffusion member;
  a rotatable substrate support assembly positioned in the enclosed processing region and having a substrate receiving surface, wherein the rotatable substrate support is adapted to rotate a substrate positioned on the substrate receiving surface relative to the platen assembly; and
  a lift assembly in communication with the rotatable substrate support assembly, wherein the lift assembly is adapted to position a substrate positioned on the substrate receiving surface relative to the diffusion member.

19. The processing chamber of claim 18, further comprising:
  a fluid source positioned outside the enclosed processing region; and
  a porous plate sealably positioned on one of the one or more walls that is adapted to allow a fluid delivered from the fluid source to pass therethrough and into the enclosed processing region.

20. A processing chamber adapted to process a substrate, comprising:
  one or more walls forming an enclosed processing region of the processing chamber;
  a platen assembly positioned in the enclosed processing region, the platen assembly comprising:
    a base member having a fluid aperture formed there through;
    a fluid diffusion member sealably positioned on the base member and having an upstream side and a downstream side, wherein the fluid diffusion member has a plurality of fluid passages in fluid communication between the upstream side and the downstream side; and
    a fluid volume formed between the base member and the upstream side of the fluid diffusion member;
  a rotatable substrate support assembly positioned in the enclosed processing region and having a substrate supporting surface that is substantially parallel to the downstream side of the fluid diffusion member, wherein the rotatable substrate support is adapted to rotate relative to the platen assembly;
  two or more fluid catch rings positioned in the processing chamber, wherein the fluid catch rings are vertically disposed in the processing chamber and at least one fluid catch ring is positioned radially outwards from the platen assembly and the rotatable substrate support during processing; and
  a lift assembly in communication with the rotatable substrate support assembly, wherein the lift assembly is adapted to position a substrate positioned on the substrate receiving surface relative to the diffusion member.

21. The processing chamber of claim 20, wherein the lift assembly is adapted to position the substrate supporting surface relative to the two or more catch cups mounted in the processing chamber so that fluid dispensed on the substrate can be separately collected in each of the two or more catch cups.

* * * * *

UNITED STATES PATENT AND TRADEMARK OFFICE
CERTIFICATE OF CORRECTION

| | |
|---|---|
| PATENT NO. | : 7,827,930 B2 |
| APPLICATION NO. | : 11/043442 |
| DATED | : November 9, 2010 |
| INVENTOR(S) | : Lubomirsky et al. |

It is certified that error appears in the above-identified patent and that said Letters Patent is hereby corrected as shown below:

In the Detailed Description of the Preferred Embodiment:

Column 6, Line 61, please delete "(110- 112)" and insert --(110 ↔ 112)-- therefor;

Column 20, Line 29, please delete "m ember" and insert --member-- therefor.

Signed and Sealed this
Eighth Day of February, 2011

David J. Kappos
*Director of the United States Patent and Trademark Office*